(12) United States Patent
De Dea et al.

(10) Patent No.: US 9,776,218 B2
(45) Date of Patent: Oct. 3, 2017

(54) CONTROLLED FLUID FLOW FOR CLEANING AN OPTICAL ELEMENT

(71) Applicant: ASML Netherlands B.V., Veldhoven (NL)

(72) Inventors: Silvia De Dea, San Diego, CA (US); Chunguang Xia, San Diego, CA (US); Gregory James Wilson, San Diego, CA (US); Brandon Wilson Verhoff, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 210 days.

(21) Appl. No.: 14/937,973

(22) Filed: Nov. 11, 2015

(65) Prior Publication Data

US 2017/0036252 A1  Feb. 9, 2017

Related U.S. Application Data

(60) Provisional application No. 62/201,955, filed on Aug. 6, 2015.

(51) Int. Cl.
*B08B 5/02* (2006.01)
*H05G 2/00* (2006.01)
(Continued)

(52) U.S. Cl.
CPC ............... *B08B 5/02* (2013.01); *G01F 1/00* (2013.01); *G03F 7/70925* (2013.01); *G03F 7/70933* (2013.01)

(58) Field of Classification Search
CPC ............ G03F 7/70008; G03F 7/70016; G03F 7/70025; G03F 7/70033; H05G 2/00;
(Continued)

(56) References Cited

U.S. PATENT DOCUMENTS 3,476,907 A  11/1969  Foex
4,687,544 A  8/1987  Bersin
(Continued)

FOREIGN PATENT DOCUMENTS

WO  2015090862 A1  6/2015

OTHER PUBLICATIONS

Brigid Delaney, European International Searching Authority, International Search Report and Written Opinion, counterpart PCT Application No. PCT/US2016/045200, dated Jan. 23, 2017, 18 pages total.
(Continued)

*Primary Examiner* — David E Smith
(74) *Attorney, Agent, or Firm* — DiBerardino McGovern IP Group LLC

(57) ABSTRACT

A fluid is directed toward a surface of an optical element based on a first flow pattern, the surface of the optical element including debris and the fluid directed based on the first flow pattern moving at least some of the debris to a first stagnation region at the surface of the optical element; and the fluid is directed toward the optical element based on a second flow pattern, the fluid directed based on the second flow pattern moving at least some of the debris to a second stagnation region on the surface of the optical element, the second stagnation region and the first stagnation region being different locations at the surface of the optical element. Directing the fluid toward the surface of the optical element based on the second flow pattern removes at least some of the debris from the first stagnation region.

19 Claims, 27 Drawing Sheets

(51) Int. Cl.
*G03F 7/20* (2006.01)
*G01F 1/00* (2006.01)

(58) Field of Classification Search
CPC .. H05G 2/001; H05G 2/003005; H05G 2/006; H05G 2/008; B08B 5/02; G01F 1/00
See application file for complete search history.

(56) References Cited

U.S. PATENT DOCUMENTS

| | | |
|---|---|---|
| 6,868,856 B2 | 3/2005 | Nowak et al. |
| 7,372,049 B2 | 5/2008 | Van Herpen et al. |
| 7,491,954 B2 | 2/2009 | Bykanov |
| 8,624,208 B2 | 1/2014 | Nagai |
| 8,872,142 B2 | 10/2014 | Nagai |
| 2003/0010355 A1 | 1/2003 | Nowak et al. |
| 2003/0223546 A1 | 12/2003 | McGregor |
| 2004/0165160 A1 | 8/2004 | Van Beek |
| 2006/0097203 A1 | 5/2006 | Bykanov |
| 2007/0125964 A1 | 6/2007 | Van Herpen et al. |
| 2009/0014666 A1 | 1/2009 | Zink et al. |
| 2009/0057567 A1* | 3/2009 | Bykanov ............ G03F 7/70033 250/429 |
| 2010/0051827 A1 | 3/2010 | Derra et al. |
| 2011/0043774 A1 | 2/2011 | Hembacher et al. |
| 2011/0188011 A1* | 8/2011 | Ehm ..................... B82Y 10/00 355/30 |
| 2011/0226745 A1 | 9/2011 | Nagai |
| 2012/0212136 A1 | 8/2012 | Einav |
| 2012/0223256 A1 | 9/2012 | Bykanov |
| 2012/0223257 A1 | 9/2012 | Nagai et al. |
| 2012/0313016 A1* | 12/2012 | Fleurov ................. H05G 2/008 250/504 R |
| 2013/0026393 A1 | 1/2013 | Abe et al. |
| 2013/0068161 A1 | 3/2013 | White |
| 2013/0126761 A1* | 5/2013 | Nagai .................... H05G 2/005 250/504 R |
| 2013/0319466 A1 | 12/2013 | Mizoguchi et al. |
| 2014/0306115 A1* | 10/2014 | Kuritsyn ........... G02B 27/0006 250/358.1 |
| 2015/0008345 A1 | 1/2015 | Nagai |
| 2015/0069273 A1 | 3/2015 | De Dea |
| 2015/0261094 A1 | 9/2015 | Huang et al. |
| 2015/0282287 A1 | 10/2015 | De Dea |

OTHER PUBLICATIONS

R.K. Grubbs et al., "Attenuation of hydrogen radicals traveling under flowing gas conditions through tubes of different materials," J. Vac. Sci. Technol. A 24(3), May/Jun. 2006, pp. 486-496.

\* cited by examiner

300

```
┌─────────────────────────────────────────┐
│ Direct fluid toward an optical element  │
│ based on a first flow pattern, the      │
│ optical element having debris on a      │
│ surface and the fluid directed based on │─── 310
│ the first flow pattern moving at least  │
│ some of the debris on the surface to a  │
│ first stagnation region                 │
└─────────────────────────────────────────┘
                    │
                    ▼
┌─────────────────────────────────────────┐
│ Direct the fluid toward the optical     │
│ element based on a second flow pattern, │
│ the optical fluid directed based on the │
│ second flow pattern moving at least     │─── 320
│ some of the debris to a second          │
│ stagnation region, the first and second │
│ stagnation regions being different      │
│ locations on the surface of the optical │
│ element                                 │
└─────────────────────────────────────────┘
```

FIG. 3

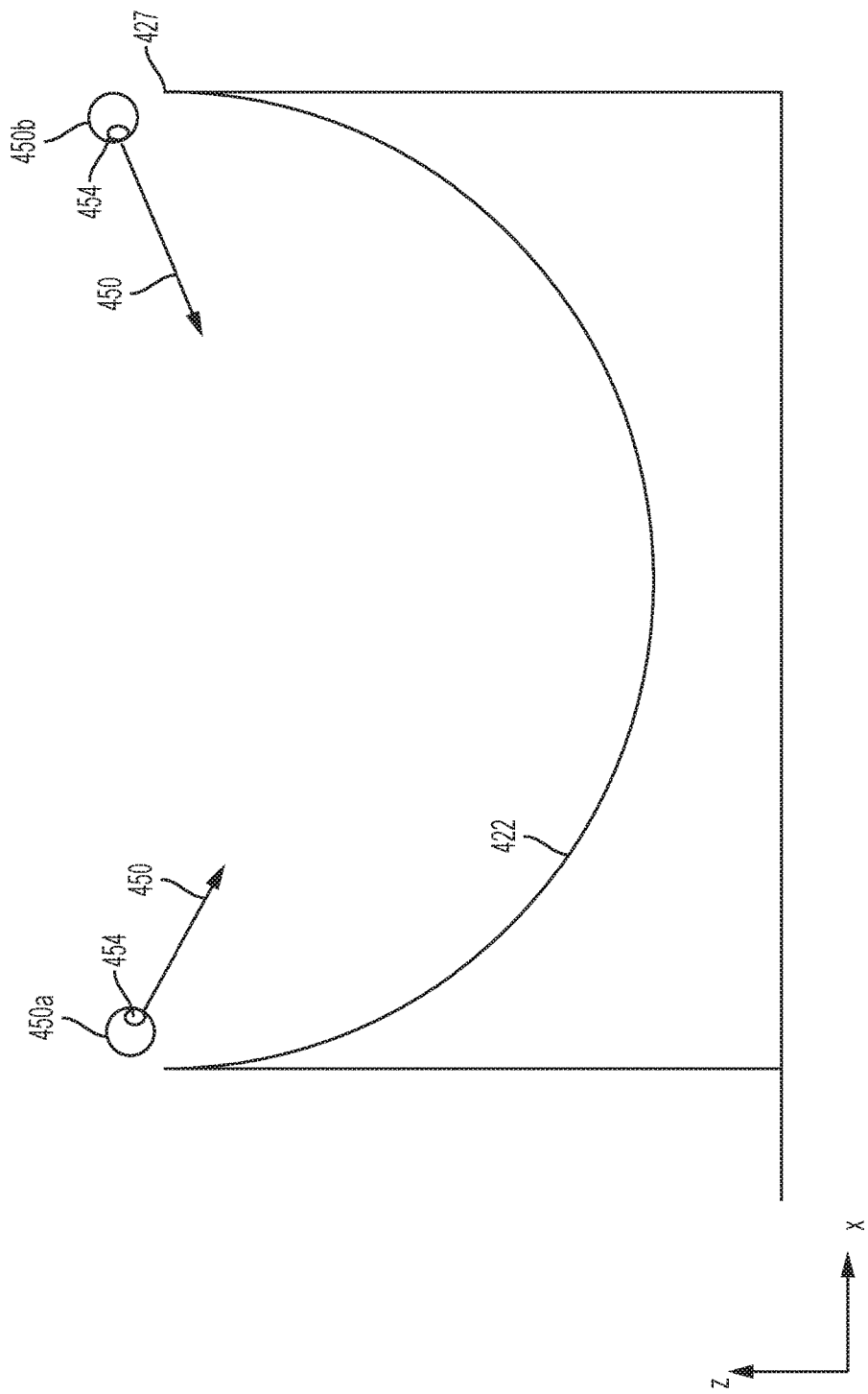

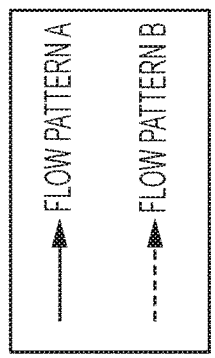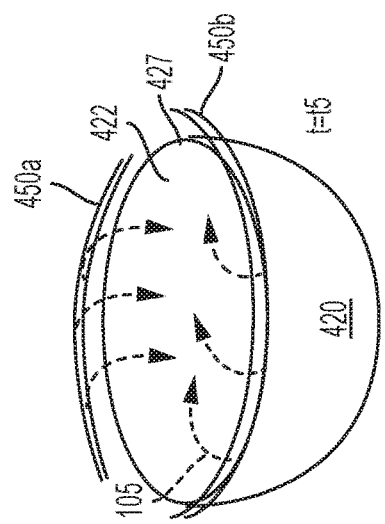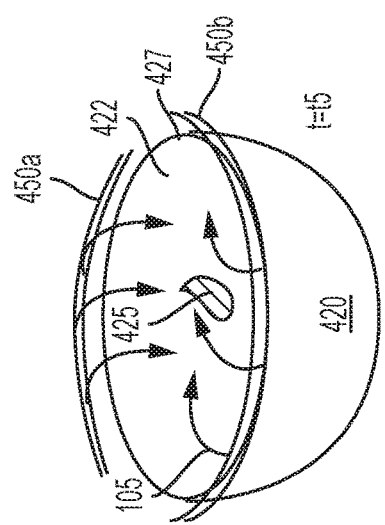
FIG. 5B
FIG. 5A

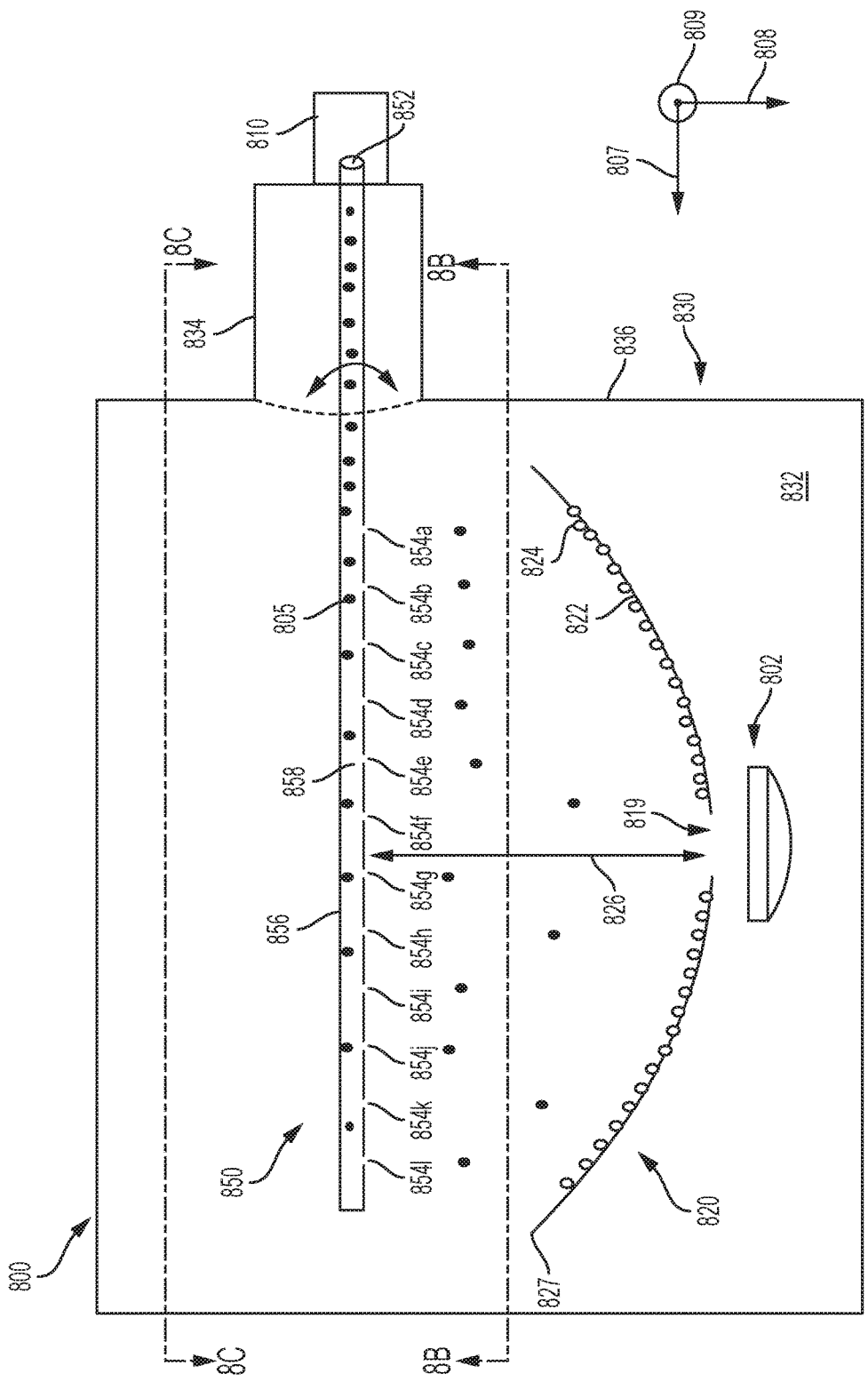

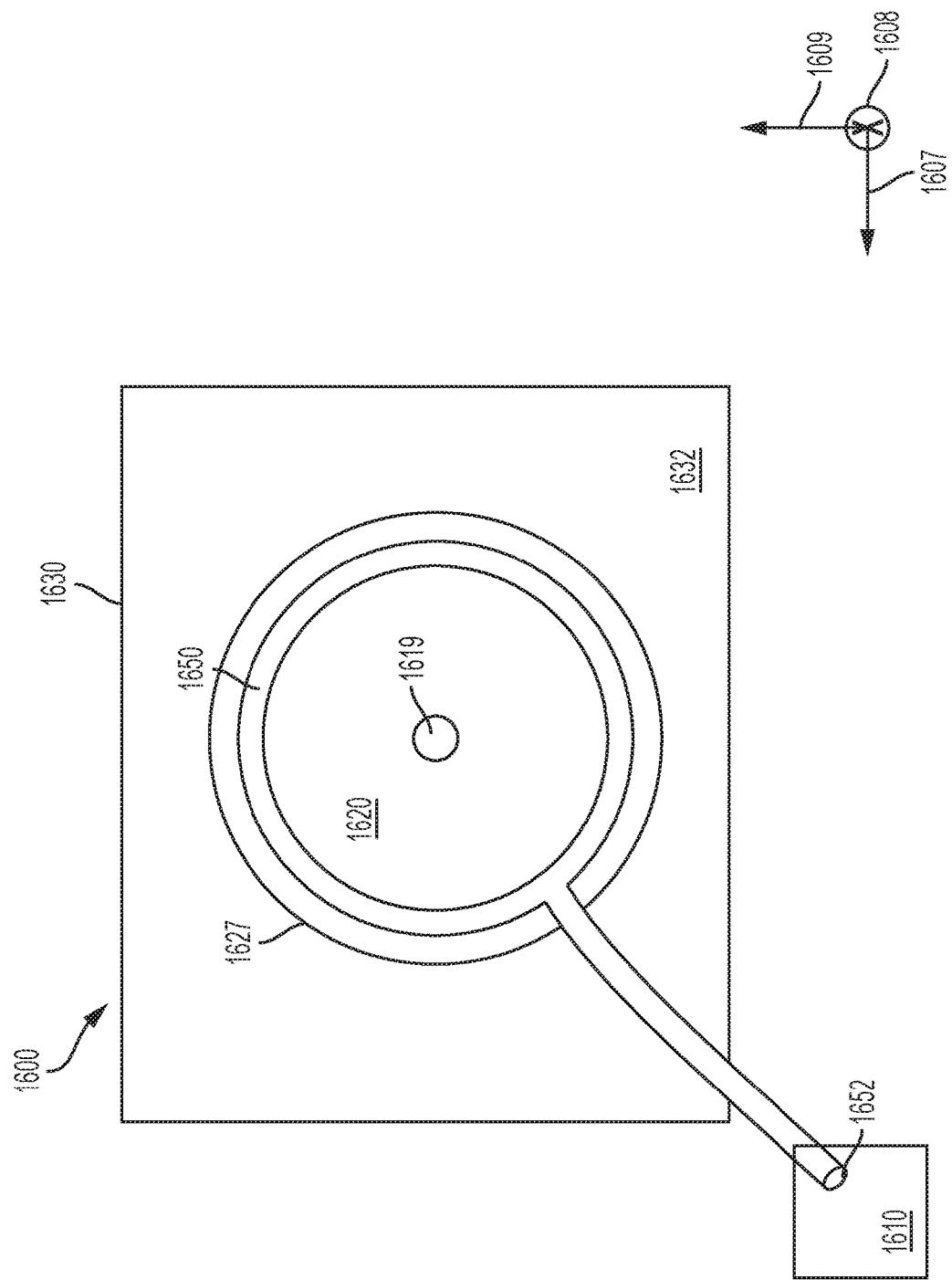

CONTROLLED FLUID FLOW FOR CLEANING AN OPTICAL ELEMENT

CROSS-REFERENCE TO RELATED APPLICATION

This application claims the benefit of U.S. Provisional Application No. 62/201,955, filed on Aug. 6, 2015 and titled CONTROLLED FLUID FLOW FOR CLEANING AN OPTICAL ELEMENT, which is incorporated herein by reference in its entirety.

TECHNICAL FIELD

The disclosed subject matter relates techniques for controlling a fluid flow to clean an optical element.

BACKGROUND

An optical element includes a surface that interacts with a light beam through refraction and/or reflection. The surface can accumulate debris such that performance of the optical element is diminished.

SUMMARY

In one general aspect, a fluid is directed toward a surface of an optical element based on a first flow pattern, the surface of the optical element including debris and the fluid directed based on the first flow pattern moving at least some of the debris to a first stagnation region at the surface of the optical element. The fluid is also directed toward the optical element based on a second flow pattern, the fluid directed based on the second flow pattern moving at least some of the debris to a second stagnation region on the surface of the optical element, the second stagnation region and the first stagnation region being different locations at the surface of the optical element. Directing the fluid toward the surface of the optical element based on the second flow pattern removes at least some of the debris from the first stagnation region.

Implementations can include one or more of the following features. The first and second flow patterns can include information sufficient to indicate a flow of the fluid toward the surface of the optical element, the information including one or more of a flow rate, a spatial distribution of the fluid relative to the surface of the optical element, and a time period during which the fluid is directed toward the surface of the optical element. The fluid can include a gas. The fluid can include a free radical. The debris can include a material that reacts or combines with the material. The free radical can combine or react with the material to thereby remove the material from the surface through one of combustion of the material, etching of the material, or reaction with the material.

In some implementations, directing the fluid based on the first flow pattern includes directing the fluid toward the surface of the optical element at a first flow rate, and directing the fluid based on the second flow pattern includes directing the fluid toward the surface of the optical element at a second flow rate. The fluid being directed based on the first flow pattern can include directing the fluid toward the surface of the optical element in a first direction, and the fluid being directed based on the second flow pattern includes directing the fluid toward the surface of the optical element in a second direction. The fluid being directed based on the first flow pattern can include directing the fluid toward the surface of the optical element at one or more of a first flow rate and a first direction, and the fluid being directed based on the second flow pattern can include directing the fluid toward the surface of the optical element at one or more of a second flow rate and a second direction.

Directing the fluid toward the surface based on the first flow pattern can include directing the fluid toward the surface of the optical element through a first conduit positioned relative to a first side of the optical element at a first flow rate and through a second conduit positioned relative to a second side of the optical element at a second flow rate; and directing the fluid toward the surface based on the second flow pattern can include directing the fluid toward the surface of the optical element through the first conduit at a third flow rate and through the second conduit at a fourth flow rate.

The fluid can be directed through the first conduit and the second conduit based on the first flow rate during a first time period, and the fluid can be directed through the first conduit and the second conduit based on the second flow rate during a second time period. The fluid can be directed through the first conduit and the second conduit concurrently during at least part of one or more of the first time period and the second time period. The first flow rate and the second flow rate can be different from each other. The third flow rate and the fourth flow rate can be different from each other, and at least one of the third flow rate and the fourth flow rate can be different from the first flow rate or the second flow rate. The first flow rate and the second flow rate can be the same as each other. The third flow rate and the fourth flow rate can be the same as each other and different from the first flow rate and the second flow rate.

In some implementations, the first flow pattern and the second flow pattern are selected from among a plurality of flow patterns. The fluid can be directed toward the surface based on the first flow pattern during a first time period, and at least some of the debris accumulates and remains in the first stagnation region during the first time period. Directing the fluid toward the surface based on the second flow pattern can move at least some of the debris from the first stagnation region to the second stagnation region.

In some implementations, an initial amount of debris is on the surface of the optical element prior to directing the fluid toward the surface based on the first flow pattern, and an amount of debris on the surface after the fluid is directed toward the surface of the optical element based on the first flow pattern is less than the initial amount of debris.

The debris can include a metal. The debris can include tin.

The first stagnation region and the second stagnation region can be non-overlapping regions at the surface of the element. The first stagnation region and the second stagnation region can be partially overlapping regions at the surface of the element.

A second fluid can be directed through the optical element.

In another general aspect, a system includes a conduit including a sidewall, the sidewall including at least one opening that passes from an interior of the conduit to an exterior of the conduit, the conduit configured to transport free radicals in the interior of the conduit and to pass the free radicals through the at least one opening that passes through the sidewall; and a control system including an electronic storage coupled to one or more electronic processors, the electronic storage including instructions that, when executed, cause the one or more electronic processors to: select a flow pattern from a plurality of flow patterns stored on the electronic storage, each of the flow patterns including information sufficient to describe a flow of the free radicals through the at least one opening, the information sufficient to describe the flow of the free radicals through the at least one opening including at least a flow rate of the free radicals over a time period, and apply the selected flow pattern to a flow controller of the system to cause the free radicals to pass through the at least one opening at a flow rate for the time period indicated by the selected flow pattern.

Implementations can include one or more of the following features. The flow patterns can also include gas flow patterns, the gas flow patterns including information sufficient to describe a flow of gas, the gas flowing in the system separately from the conduit, and the information sufficient to describe the flow of the gas including a flow rate of the gas over a gas time period, and the instructions can also include instructions that, when executed, cause the one or more processors to apply the selected gas flow pattern to the flow controller of the system to cause the gas to flow in the system at a gas flow rate for a gas time period indicated by the selected gas flow pattern.

The conduit can be configured for placement relative to an optical element in a vacuum chamber of an extreme ultraviolet (EUV) light source. The optical element can include a collector mirror, the collector mirror having an aperture, the selected flow pattern includes a selected gas flow pattern, and applying the selected gas flow pattern to the flow controller of the system can cause the gas to flow through the aperture of the collector mirror at the gas flow rate and during the gas time period indicated by the selected gas flow pattern. In some implementations, the conduit includes at least two curved portions, the curved portions having a curvature that follows a perimeter of the collector mirror, the selected flow pattern describes the flow of free radicals through each of the at least two curved portions, applying the selected gas flow pattern causes the gas to flow through the aperture of the mirror, and around a perimeter of the mirror, and applying the selected flow pattern causes the free radicals to flow from at least one of the at least two curved portions.

In another general aspect, a first flow pattern is accessed, the first flow pattern including information sufficient to information sufficient to describe a flow of free radicals and a gas relative to an optical element, free radicals are directed toward the optical element based on the first flow pattern, the free radicals being directed through a plurality of paths and at different flow rates in at least two of the paths; and the gas is directed toward the optical element based on the first flow pattern, the gas being directed along a path that is different from any of the paths along which the free radicals are directed.

Implementations of any of the techniques described above may include a transport system for a laser produced plasma EUV light source, an EUV light source, a system for retrofitting an EUV light source, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

FIG. 3 is a flow chart of an example of a process for cleaning an optical element.

FIG. 4C is a side cross-sectional view of the optical element and conduits of FIG. 4A.

FIGS. 5A and 5B are perspective views of the optical element and conduits of FIG. 4A during a cleaning cycle.

FIG. 8A is a side view of a block diagram of an example of a free radical transport system.

FIG. 16 is a view of an example of a free radical transport system.

DETAILED DESCRIPTION

Techniques for controlling a flow of fluid to clean an optical element that is a part of and operates within an optical system are disclosed. The techniques allow the optical element to be cleaned without removing the element from its operating environment within the optical system. In some implementations, the optical element can be cleaned while the optical system is operating. In this way, the techniques discussed herein can lead to improved performance and efficiency of the optical system.

Figure 1A:
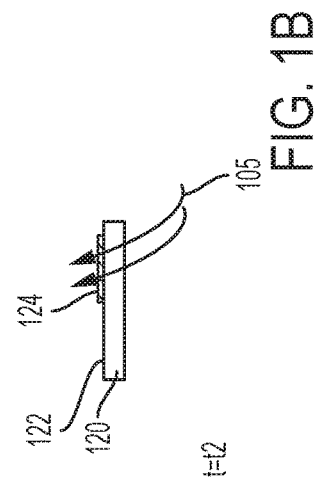
FIGS. 1A and 1B are side views of an example of an optical element at two different times.
Figure 1B:
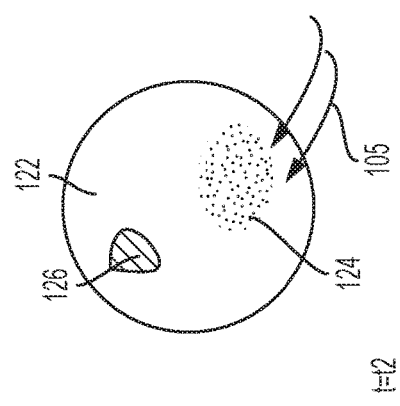
Figure 1C:
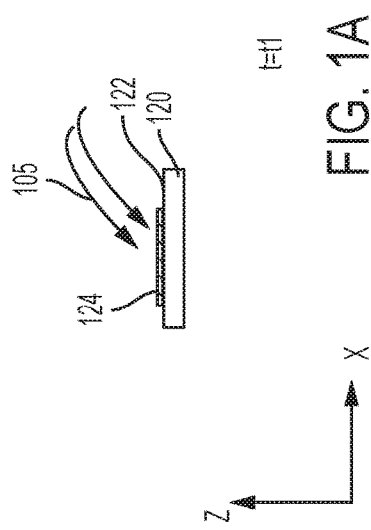
FIGS. 1C and 1D are top views of the optical element of FIGS. 1A and 1B, respectively.
Figure 1D:
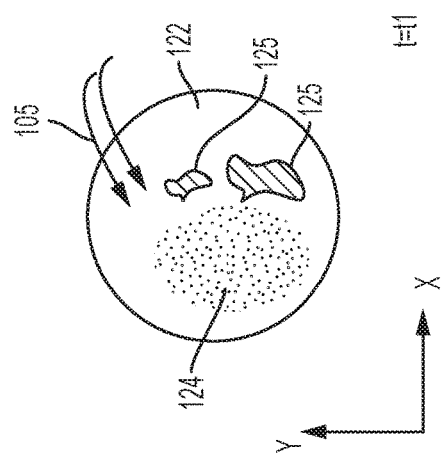
Figure 1F:
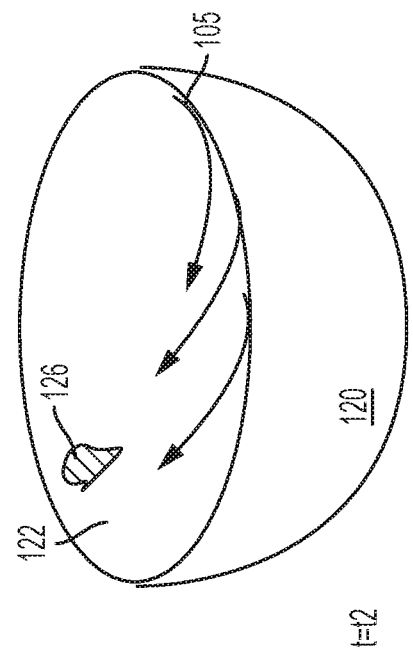
FIGS. 1E and 1F are perspective views of the optical element of FIGS. 1A and 1B, respectively.
Figure 1E:
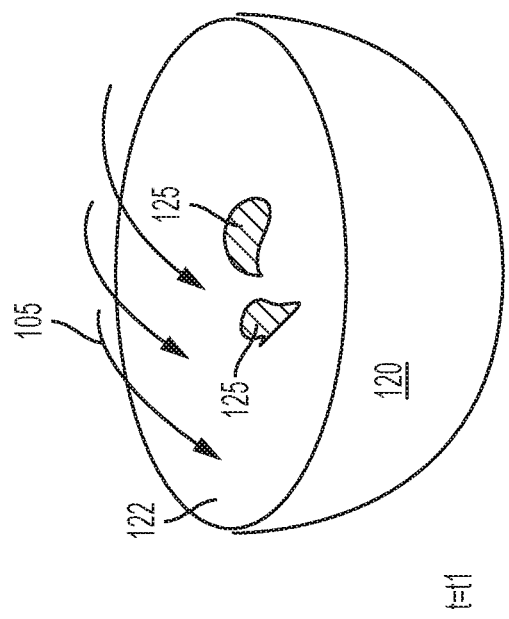

Referring to FIGS. 1A-1F, an optical element 120 is shown. FIGS. 1A and 1B show the optical element 120 from the side at two different times, t1 and t2, respectively. FIGS. 1C and 1D are top views of the optical element 120 at the times t1 and t2, respectively. FIGS. 1E and 1F show a perspective view of the optical element at the times t1 and t2, respectively.

The optical element 120 can be any type of element or apparatus that is capable of interacting with an optical (or light) beam of the optical system. For example, the optical element 120 can be a mirror, lens, a prism, or a combination of such components. The optical element 120 includes a surface 122 that interacts with the optical beam through reflection and/or refraction.

The surface 122 can accumulate debris 124, which can hinder the performance of the optical element 120. The debris 124 can be, for example, dust and/or metallic particles. The optical element 120 can be part of an optical system such as an extreme ultraviolet (EUV) light source that produces EUV light by converting a metal target to plasma. In addition to producing EUV light, the plasma production process can also produce debris in the form of particles, vapor residue, or pieces of matter (such as metal) that is in the target. This debris can accumulate on the surfaces of objects in the path of the plasma. When the element 120 is used in an EUV light source, the debris 124 can include these plasma-related products.

During a cleaning cycle, a fluid 105 is directed toward the surface 122 to clean the optical element 120 by removing the debris 124 from the surface 122. For example, the fluid 105, or a substance carried by the fluid 120, can react or combine with the debris 124 to remove the debris 124 from the surface 122. The fluid 105 also can remove the debris from the surface 122 by physical force.

The fluid 105 flows or moves relative to the surface 122. Thus, in addition to removing debris from the surface 122, if all of the debris 124 is not removed, the fluid 105 can transport the remaining debris 124 to another portion of the surface 122. The transported debris can become trapped or accumulate in certain locations on the surface 122, and these locations are referred to as "stagnation regions." The location of the stagnation region or regions depends on the characteristics of the flow of the fluid 105 (for example, the flow rate and/or direction) and characteristics of the surface 122 (for example, the shape of the surface 122 and the material of the surface 122). The characteristics of the flow of the fluid 105 are described by a flow pattern, which can include information such as, for example, flow rate, flow direction, and/or a time for which the fluid 105 is directed at the surface 122 at a particular flow rate and in a particular direction.

Because the location of the stagnation region or regions depends on the characteristics of the flow of the fluid 105, changing the flow pattern of the fluid 105 during the cleaning cycle can result in the stagnation region or regions moving to different locations on the surface 122. By moving the stagnation region, debris trapped in a stagnation region formed by one flow pattern is freed and can be removed by the fluid 105 that flows based on another flow pattern. In this way, cleaning the surface 122 becomes more effective and faster.

In the example shown in FIGS. 1A, 1C, and 1E, the fluid 105 is directed toward the surface 122 based on a first flow pattern. In other words, the fluid 105 is directed toward the surface 122 at a flow rate and/or direction relative to the surface 122 as dictated or indicated by information that defines the first flow pattern. The interaction between the fluid 105 and the debris 124 can remove some of the debris 124 from the surface 122, and the fluid 105 also transports some of the debris 124 to other parts of the surface 122. Of the debris 124 that is not removed from the surface 122, a relatively large amount of the transported debris accumulates at first stagnation regions 125.

Referring to FIGS. 1B, 1D, and 1F, at the time t2, the fluid 105 is directed toward the surface 122 based on a second flow pattern, which is a different flow pattern than the first flow pattern. In the example of FIGS. 1B and 1D, the second flow pattern directs the fluid 105 toward the surface 122 in a different direction as compared to the first flow pattern. Directing the fluid 105 toward the surface 122 based on the second flow pattern removes some of the debris 124 from the surface 122. Further, because the fluid 105 flows relative to the surface 122 in a different direction than it does at the time t1, the fluid 105 interacts with accumulated debris in the first stagnation region 125. Through the interaction, the fluid 105 removes debris from the first stagnation region 125.

Additionally, the fluid 105 can transport some of the debris on the surface 122 (including debris in the first stagnation region 125) to another location on the surface 122. Some the transported debris can accumulate in a second stagnation region 126. The second stagnation region 126 is in a different location on the surface 122 than the first stagnation region 125 in that at least some of the second stagnation region 126 includes a part of the surface 122 that is not included in the first stagnation region 125. Thus, the first and second stagnation regions 125, 126 can be regions that partially spatially overlap or can be regions that do not share any common spatial points on the surface 122.

Figure 2:
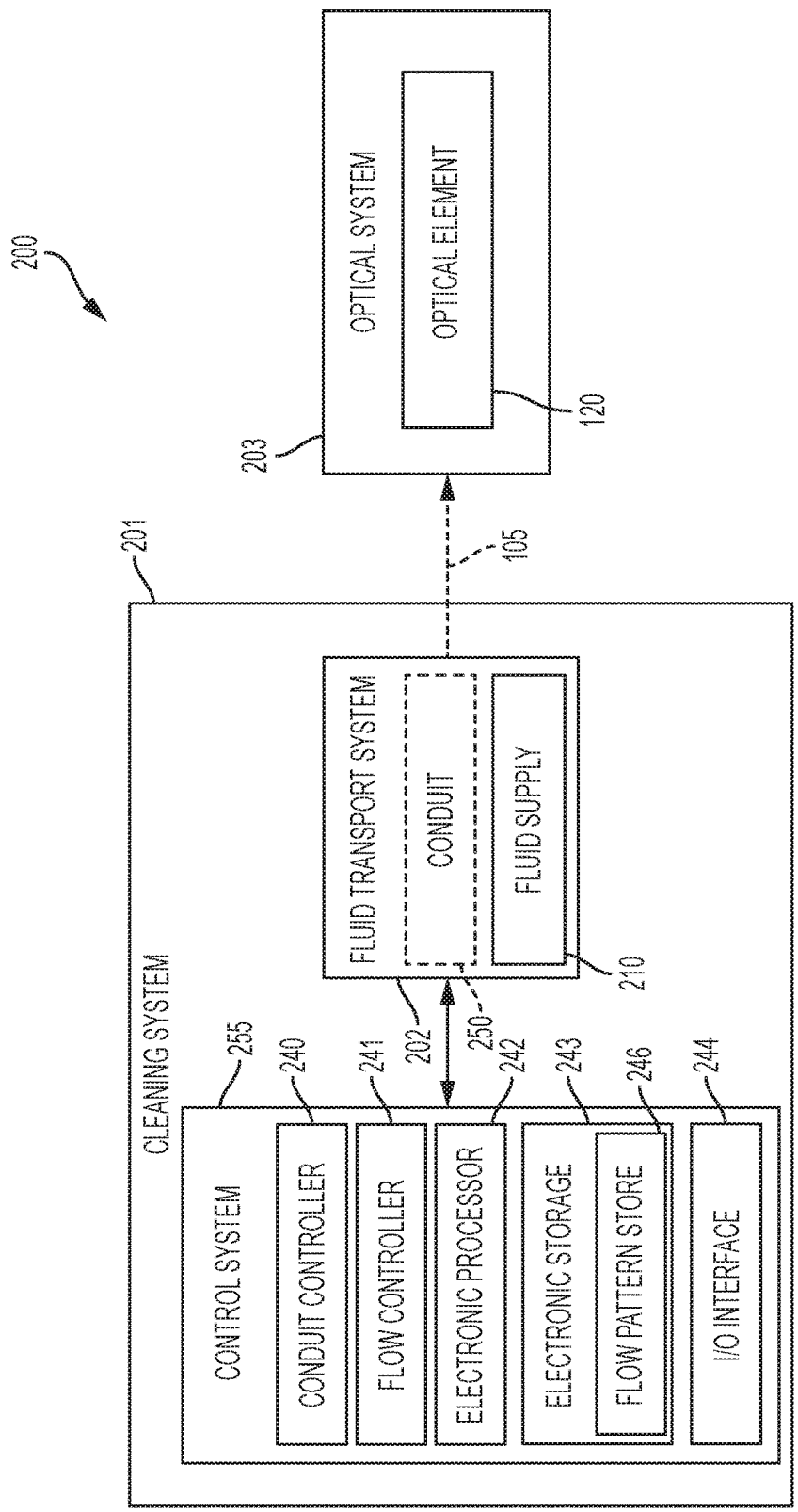
FIG. 2 is a block diagram of an example of a system that includes an optical system, which uses an optical element such as the optical element of FIGS. 1A-1F.

Referring to FIG. 2, a block diagram of an example of a system 200 that includes an optical system 203, which uses the optical element 120. The system 200 includes a cleaning system 201 that directs the fluid 105 toward the optical element 120 to clean the surface 122 of the optical element 120. The optical element 120, which can be any component capable of interacting with optical energy or an optical (light) beam, is part of an optical system 203. The optical system 203 can be any type of system that uses the optical element 120 to manipulate, produce, and/or interact with optical energy. For example, the optical system 203 can be a laser, an optical amplifier, or an imaging system. The optical system 203 can be a light source used to produce extreme ultraviolet (EUV) light. An example of an implementation in which the optical system 203 is an EUV light source are discussed with respect to FIG. 17.

The cleaning system 201 includes a control system 255 that controls a fluid transport system 202. The fluid transport system 202 includes a fluid supply 210, which provides the fluid 105. In some implementations, the fluid transport system 202 also includes a conduit 250 that is coupled to the fluid supply 210 and receives the fluid 105 from the fluid supply 210. The conduit 250 can transport some or all of the fluid 105 to the optical system 203.

The fluid 105 can include free radicals, and, in these implementations, the fluid supply 210 includes a source of free radicals. In implementations in which the fluid 205 includes free radicals, the fluid supply 210 can be a microwave plasma generator. To produce free radicals with such a source, a gas from which the free radicals are formed is provided to the fluid supply 210. For example, to produce hydrogen radicals, hydrogen gas ($H_2$) is provided. An additional gas can be added to the gas prior to providing the gas to the fluid supply 210. For example, a mixture of argon and oxygen ($Ar/O_2$) can be added to the hydrogen gas.

Alternatively or additionally, the fluid supply 210 also can include a source of gas that does not include free radicals. For example, the fluid supply 210 can provide diatomic molecular hydrogen ($H_2$) gas, helium gas (He), and/or argon gas (Ar). The fluid supply 210 can include more than one source of gas. For example, the fluid supply 210 can include two separate sources of gas.

The cleaning system 201 also includes the control system 255. The control system 255 controls the flow of the fluid 105. For example, the control system 255 can apply a particular flow pattern or a sequence of flow patterns to indicate how the fluid 105 is delivered to the optical system 203.

The example control system 255 shown in FIG. 2 includes a conduit controller 240, a flow controller 241, an electronic processor 242, an electronic storage 243, and an input/output (I/O) interface 244. In implementations that include the conduit 250, the conduit controller 240 controls the position of the conduit 250 relative to the optical element 120. The conduit controller 240 can change or set the distance between the conduit 250 and the optical element 120 and/or can rotate the conduit 250 relative to the optical element 120. The conduit controller 240 can be used to position the conduit 250 relative to the optical element 120 when the conduit 250 is initially installed in the system 200, after the conduit 250 has been installed in the system 200, and/or while the system 200 is in use.

The conduit controller 240 can include components that are electronically controlled. For example, the conduit 250 can be coupled to a stepper motor or other device that moves the conduit 250 when activated by a user or an automated electronic process. The conduit controller 240 can include components that are configured for manual operation, for example, with a lever, wheel, or other mechanical device that is accessible from outside of the system 200 and allows an operator of the system 200 to move the conduit 250.

In some implementations, the control system 255 does not include the conduit controller 240. For example, in some implementations that include the conduit 250, the conduit 250 is permanently positioned relative to the optical element 120 and is not moved after installation or during use. In these implementations, the control system 255 can lack the conduit controller 240 or the conduit controller 240 can be disabled.

The flow controller 241 is used to control the flow of the fluid 105. The flow controller 241 can include a mass flow controller that measures and/or controls the flow of the fluid 105 and a pressure controller that controls the relative pressure between the fluid supply 210 and the optical system 203.

The electronic processor 242 is one or more processors suitable for the execution of a computer program such as a general or special purpose microprocessor, and any one or more processors of any kind of digital computer. Generally, a processor receives instructions and data from a read-only memory or a random access memory or both. The electronic processor 242 can be any type of electronic processor.

The electronic storage 243 can be volatile memory, such as RAM, or non-volatile memory. In some implementations, the electronic storage 243 can include both non-volatile and volatile portions or components. The electronic storage 243 stores instructions, perhaps as a computer program, that, when executed, cause the processor 242 to communicate with other components in the control system 255.

The electronic storage 243 also includes a flow pattern store 246. The information sufficient to define a plurality of flow patterns is stored in the flow pattern store 246. The information in each of the flow patterns in the flow pattern store 246, when applied to the fluid transport system 202 by the control system 255, causes the fluid 205 to be delivered to the optical element 120 in a manner that is specified by the flow pattern. The control system 255 can receive an input from a human operator or an automated electronic process at the I/O interface 244 requesting that a particular flow pattern, or sequence of flow patterns that form a "recipe," be applied to the fluid transport system 202. The control system 255 can implement the various flow patterns by, for example, communicating a command to the flow controller 241 to cause the mass flow controller to measure or determine the current flow rate of the fluid 205 and adjust the flow rate to match the flow rate specified by the flow pattern.

The flow patterns stored in the flow pattern store 246 can be stored in association with one or more specific configurations of the optical system 203 and/or with one or more optical systems. In this way, an operator of the system 200 (or an automated process) can select a flow pattern or a series of flow patterns that are optimized for a particular optical system and/or configuration.

The I/O interface 244 is any kind of electronic interface that allows the control system 255 and/or its components to receive and/or provide data and signals to an operator and/or an automated process running on another electronic device. For example, the I/O interface 244 can include one or more of a touch screen or a communications interface.

Referring to FIG. 3, a flow chart of an example process 300 is shown. The process 300 is discussed with respect to the system 200 of FIG. 2. However, the process 300 can be performed by other systems. The process 300 can be implemented as instructions stored on the electronic storage 243 and performed by the electronic processor 242 and the other components of the control system 255. In some implementations, the process 300 can be stored on a separate tangible computer-readable medium and used to retrofit or upgrade an existing system.

The fluid 105 is directed toward the optical element 120 based on a first flow pattern (310). The optical element 120 includes the surface 122, and the fluid 105 can be directed toward the surface 122 of the optical element 120. The first flow pattern is information that defines how the fluid 105 interacts with the optical element 120. For example, the first flow pattern can indicate a flow rate, a spatial distribution of the fluid 105 relative to the optical element 120, and/or a direction of flow of the fluid 105 relative to the optical element 120.

The fluid 105 can include free radicals. A free radical is an atom, molecule, or ion that has an unpaired valence electron or an open electron shell, and, therefore, may be seen as having a dangling covalent bond. The dangling bonds can make free radicals highly chemically reactive, that is, a free radical can react readily with other substances. Because of their reactive nature, free radicals can be used to remove a substance (such as the debris 124) from an object (such as the surface 122 of the optical element 120). The free radicals can remove the debris by, for example, etching, reacting with and/or combusting the debris.

The fluid 105 can be a gas that does not include free radicals. In these implementations, the fluid supply 210 can provide, for example, diatomic molecular hydrogen ($H_2$) gas, helium gas (He), and/or argon gas (Ar). The fluid 105 also can be a mixture of free radicals and a gas. In some implementations, the fluid 105 includes both free radicals and gas, and the free radicals and gas are directed toward the optical element 120 through different paths or mechanisms. The neutral gas can be a carrier gas for transporting the radicals to destinations.

The fluid 105 is directed toward the optical element 120 based on a second flow pattern (320). The fluid 105 can be directed toward the surface 122 of the optical element 120.

The second flow pattern is different from the first flow pattern. For example, the fluid 105 can have a different flow rate, direction, spatial pattern, and/or duration when directed toward the optical element 120 based on the second flow pattern as compared to the first flow pattern. The fluid 105 flows relative to the surface 122 and removes debris 124 from the surface 122. The fluid 105 also can transport some of the debris 124 relative to the surface 122, and a portion of the transported debris can accumulate in the second stagnation region 126.

The fluid 105 is directed toward the optical element 120 in any manner. For example, the fluid 105 can be generated inside of the optical system 203 and provided to the optical element 120 without a structure to transport the fluid 105. In some implementations, all or some of the fluid 105 can be delivered to the optical element 120 with the conduit 250.

Figure 4A:
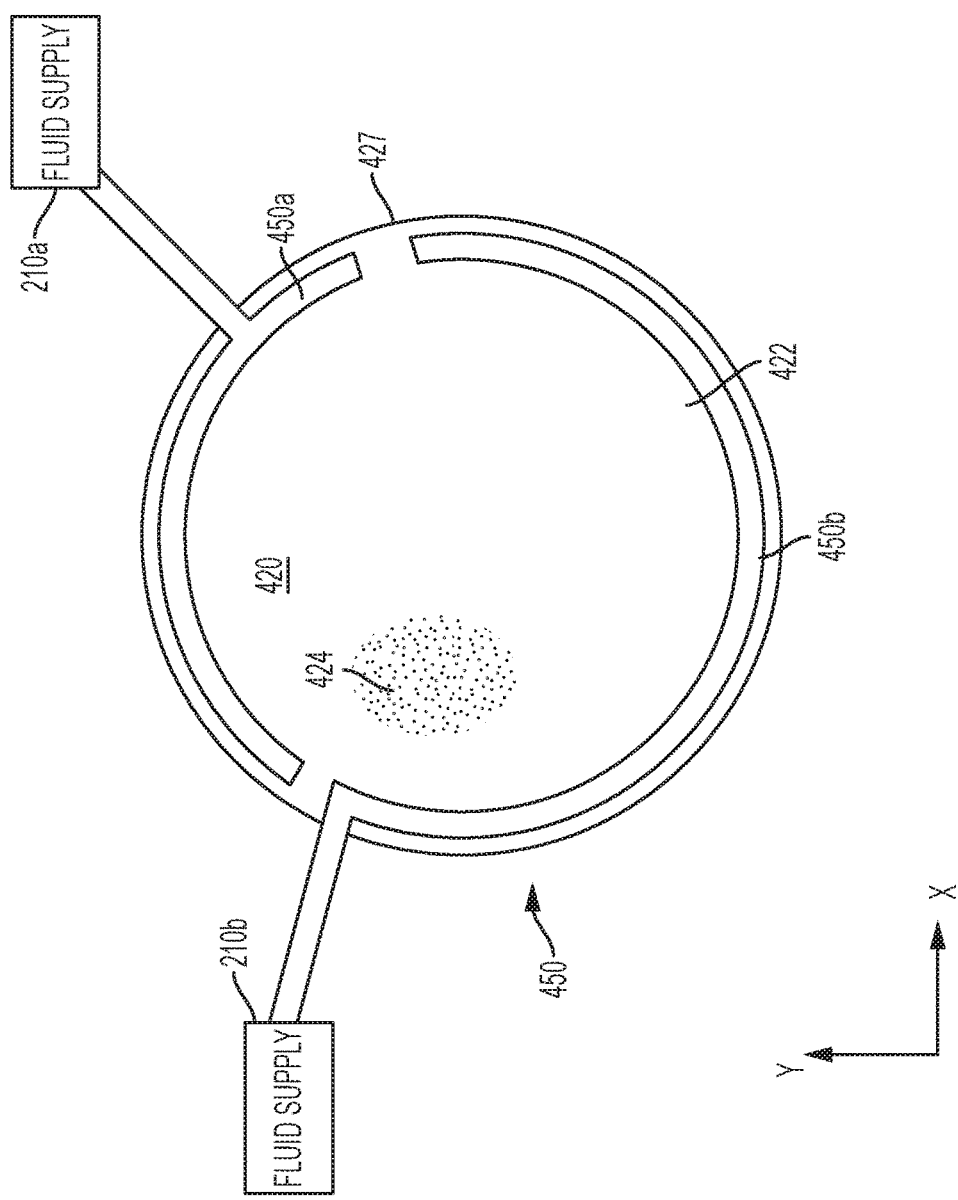
FIG. 4A is a top view of an example of an optical element and conduits.
Figure 4B:
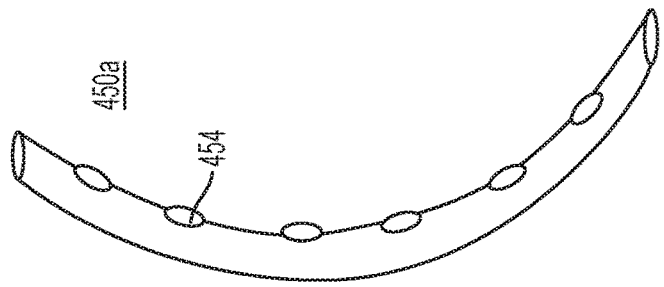
FIG. 4B is a partial perspective view of one of the conduits of FIG. 4A.

Referring also to FIGS. 4A-4C, an optical element 420 and a two-piece conduit 450 are shown. The conduit 450 includes a first conduit 450a and a second conduit 450b. The conduits 450a, 450b are positioned at a perimeter 427 of the optical element 420. In the discussion below, the optical element 420 is in the optical system 203, and the fluid 105 is delivered to the optical element 420 through the conduit 450.

FIG. 4A is a top view of the optical element 420 and the conduits 450a, 450b. FIG. 4B is a partial perspective view of the conduit 450a and apertures 454 through which the fluid 105 exits the conduit 450a. The conduit 450b also includes a plurality of apertures through which the fluid 105 flows. FIG. 4C is a side cross-sectional view of the optical element 420 and the conduits 450a, 450b. The optical element 420 includes a surface 422, which interacts with light through reflection and/or reflection. The surface 422 of the optical element 420 is curved in a concave shape in the x-z plane (FIG. 4C). In this example, the fluid supply 210 (FIG. 2) includes two separate fluid supplies 210a and 210b, one connected to each of the conduits 450a and 450b.

FIGS. 5A and 5B are perspective views of the optical element 420 and partial perspective views of the conduits 450a, 450b while the fluid 105 flows toward the optical element 420 based on the flow pattern A and the second flow pattern B, respectively.

FIGS. 5A and 5B illustrate the fluid 105 flowing during a cleaning cycle governed by the process 300 to clean the optical element 420. In the cleaning cycle illustrated in FIGS. 5A and 5B, the fluid 105 is directed toward the optical element 420 based on two different flow patterns, a flow pattern A (represented by solid arrows) that is applied during a time period A, and a flow pattern B (represented by dashed arrows) that is applied during a time period B. In this example, the flow patterns A and B define a recipe for cleaning the optical element 420 in a single cleaning cycle. The cleaning cycle occurs while the optical element 420 is in the optical system 203. Although in this example the cleaning cycle includes a plurality of flow patterns, in some implementations, the cleaning cycle includes a single flow pattern.

Referring to FIG. 5A, the fluid 105 is directed toward the optical element 420 based on the flow pattern A. Information that describes the flow pattern A is stored on the flow pattern store 246 of the cleaning system 201, and the information is retrieved by the control system 255 and applied to the fluid transport system 202. In this example, the information that describes the flow pattern A causes the fluid 105 to be directed through the conduit 450a and the conduit 450b for time period that is also indicated by the information that describes the flow pattern A.

The information that describes the flow pattern A can be, for example, instructions stored on the electronic storage 243 that, when executed by the electronic processor 242, cause the fluid supply 210a to deliver the fluid 105 into the conduit 450a at a first flow rate and cause the fluid supply 210b to deliver the fluid 105 into the conduit 450a at a second flow rate. The first and second flow rates are individually controllable, and can be the same flow rate or different flow rates. The information that defines the flow pattern A can include specific flow rates at which the fluid 105 is to flow in the conduits 450a and 450b, or the flow pattern A can specify a ratio between the flow rates that the flow 105 is to flow in the conduit 450a relative to the flow rate in the conduit 450b.

Although in this example the information that describes the flow pattern A results in the fluid 105 flowing from both the conduit 450a and the conduit 450b, in other examples the fluid 105 can flow from one of the conduits 450a, 450b.

The information that describes the flow pattern A also can define the direction in which the fluid 105 flows relative to the surface 422. For example, the information that describes the flow pattern A can include instructions that cause the conduit controller 240 to move the conduit 450a and/or the conduit 450b relative to the surface 422 to direct the fluid 105 in a particular direction. The instructions can cause the conduit 450a and/or the conduit 450b to move by translating the conduit 450a and/or 450b relative to the surface 122 in the x-y plane, moving the conduit 450a and/or 450b closer to or farther from the surface 122 in the x-z or y-z planes, and/or by rotating the conduit 450a and/or 450b and the opening 454 relative to the surface 122.

The information that describes the first flow pattern also can determine how long the fluid 105 is directed toward the optical element 420 based on the flow pattern A. In the example of FIG. 5A, the fluid 105 is directed toward the optical element 420 for the time period A, which can also be specified by the information that defines the flow pattern A. The time period A can be, for example, minutes or hours.

When directed toward the surface 122 based on the first flow pattern, the fluid 105 moves relative to the surface 422, removing debris 424 from the surface 422 and also transporting some of the debris 424 to other portions of the surface 422. The combination of the flow of the fluid 105 and the shape of the surface 422 causes a large portion of the debris that is not removed from the surface 422 to become trapped in a stagnation region that is at a location 425 on the surface 422.

Referring to FIG. 5B, the fluid 105 is directed toward the optical element 420 based on the flow pattern B. Directing the fluid 105 based on the flow pattern B causes the stagnation region to move, allowing the fluid 105 to remove the debris that became trapped at the location 425.

Like the information that defines the flow pattern A, the information that defines the flow pattern B can include, for example, flow rates for the fluid 105, a direction of flow for the fluid 105 that exits the conduit 450a and/or 450b, and/or a duration of time (time period B) during which the fluid 105 flows toward the surface 422 based on the flow pattern B. Some or all of these parameters of flow pattern B can be different from the parameters of flow pattern A. For example, flow pattern B can be defined by information that specifies that the flow rates in conduit 450a and 450b are different, and flow pattern A can be defined by information that specifies that the flow rates in 450a and 450b are the same.

Thus, the information that describes the flow pattern B causes the fluid 105 to flow toward the surface 422 in a different manner as compared to when the fluid is directed toward the surface 422 based on the flow pattern A. By changing the characteristics of the flow of the fluid 105, debris trapped in the stagnation region located on the surface 422 at location 425 during the time period A (associated with the flow pattern A) can be removed from the surface 422 of the optical element 420. The debris is removed from the surface 422 while the optical element 420 is in the optical system 203. The fluid 105 can be directed toward the optical element 422 while the optical system 203 is in use (for example, while the surface 422 interacts with light). Thus, the procedure 300 allows the optical element 420 to be cleaned with minimal to no downtime of the system 200.

The fluid 105 that flows based on the flow pattern B also can create a stagnation region in a different location of the surface than the location 425.

As discussed above, the optical system 203 can be an EUV light source, and the optical element 120 or 420 can be an optical element in the EUV light source. The fluid 105 can include free radicals that react with the debris on the surface of the optical element to remove the debris from the surface. Additionally, the fluid 105 can include gases that do not include free radicals. Further, other gases and/or fluids can be directed toward the optical element to enhance the removal of debris from the optical element. The fluid 105 and/or other fluids can be directed toward the optical element through a conduit or through an opening or passageway formed in physical element or between a plurality physical elements.

Figure 17:
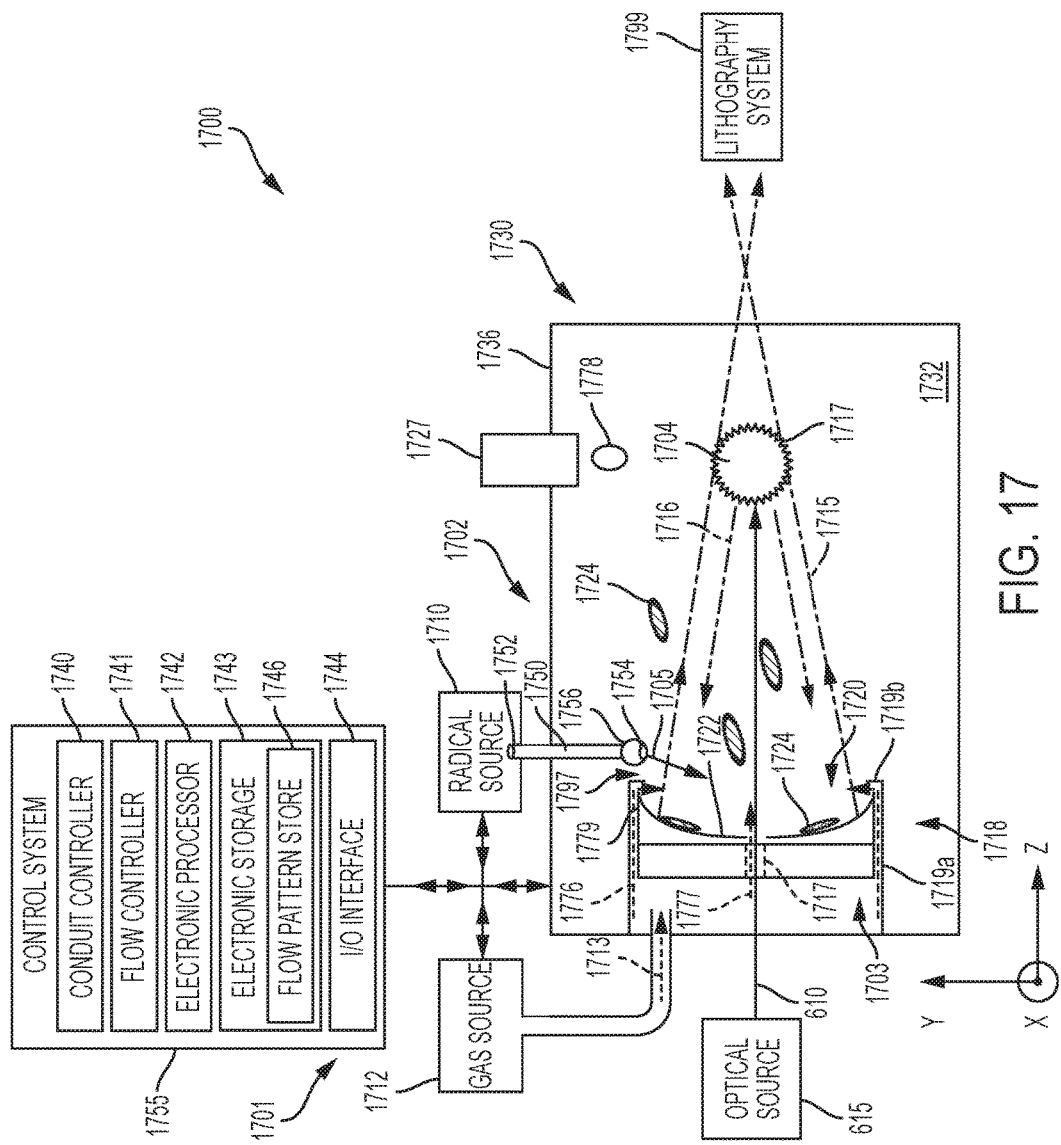
FIG. 17 is a block diagram of an example of a EUV light source.
Figure 18A:
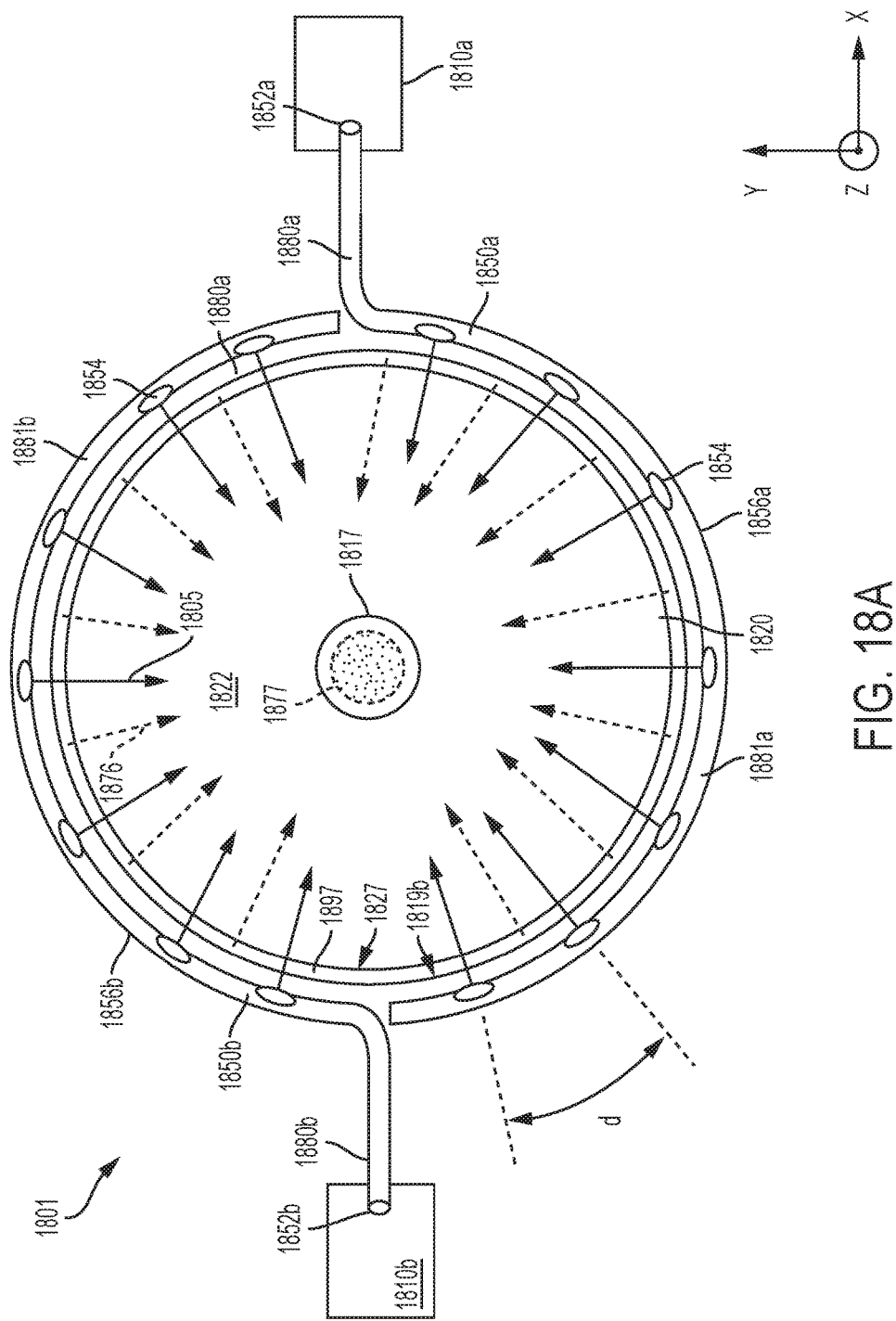
FIG. 18A is a front view of an example of a fluid transport system.
Figure 18B:
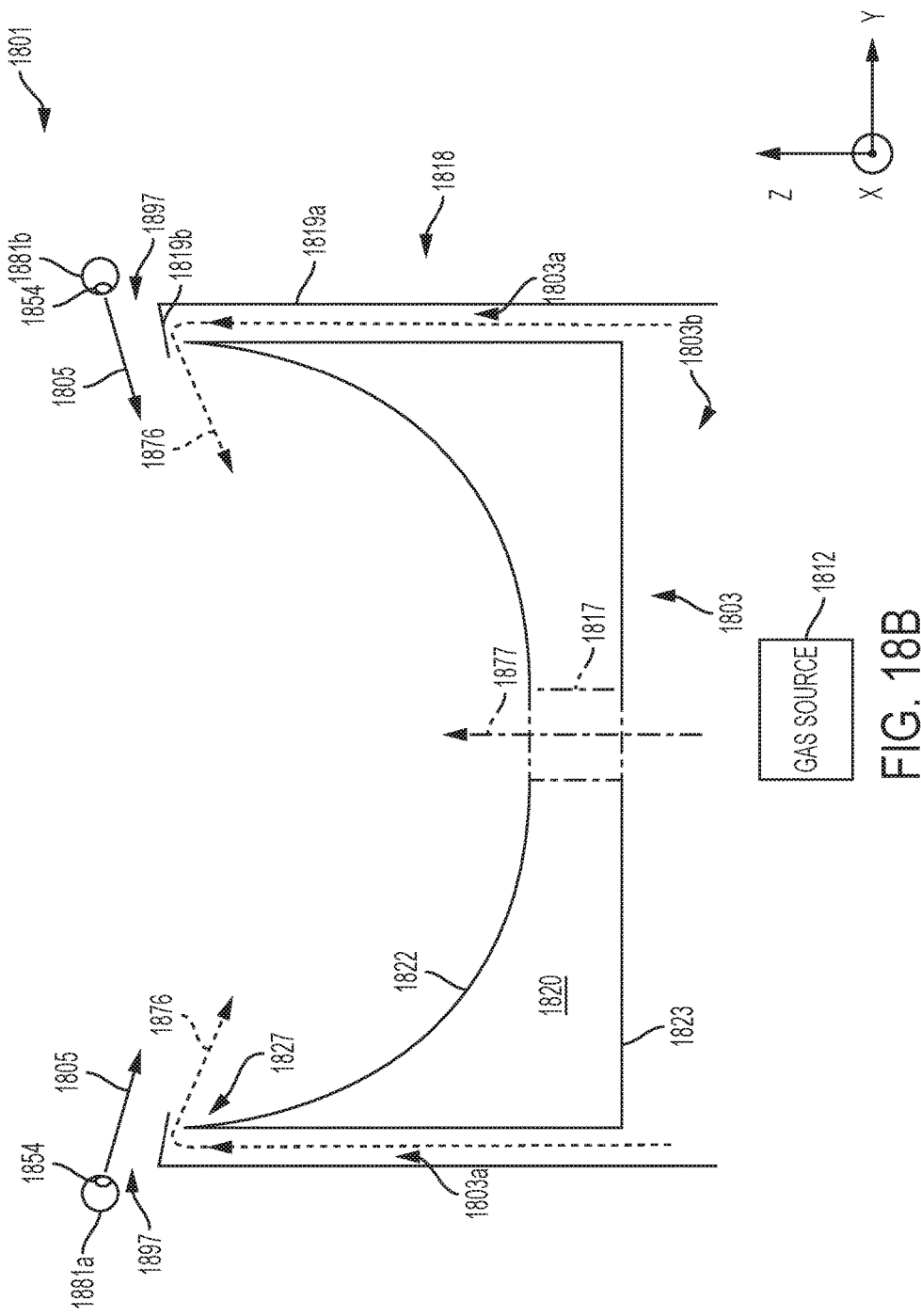
FIG. 18B is a side view of the system of FIG. 18A.

Various examples of conduits, systems, and configurations in which a cleaning fluid can flow based on a flow patterns are discussed below. An example of an EUV light source 600 is discussed with respect to FIGS. 6A and 6B. FIGS. 7A-7C, 8A-8C, 9, 11B, 12A and 12B, and 13 relate to examples of free radical transport systems that can be used to deliver free radicals to an element in the EUV light source 600 or in other EUV light sources. FIGS. 10-12 and 11A show examples of conduits that transport free radicals (and these conduits can be used as the conduit 250 in the system 200). FIG. 17 shows an example of another EUV light source, and FIGS. 18A and 18B show an example of fluid transport system.

Before discussing the flow patterns in more detail, an EUV light source discussed.

Figure 6A:
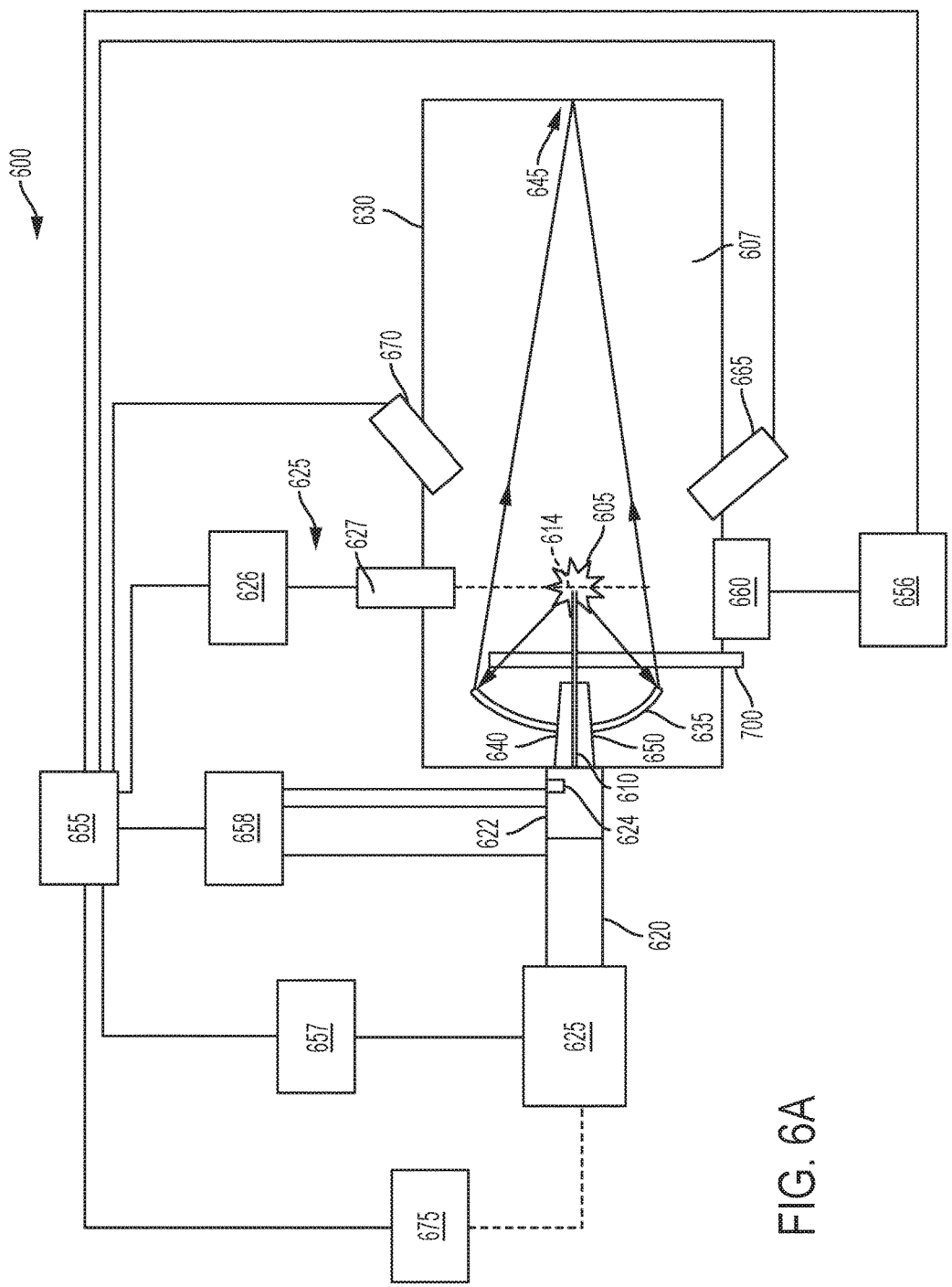
FIG. 6A is a block diagram of an example of a laser produced plasma extreme ultraviolet (EUV) light source.

Referring to FIG. 6A, an LPP EUV light source 600 is shown. The LPP EUV light source 600 includes a free radical transport system 700. The transport system 600 is shown as being part of the source 600. However, the transport system 700 can be removed from and reinserted into the source 600. The EUV light source 600 is discussed before discussing the free radical transport system 700. The free radical transport system 700 is discussed in greater detail beginning with FIG. 7A.

The LPP EUV light source 600 is formed by irradiating a target mixture 614 at a target location 605 with an amplified light beam 610 that travels along a beam path toward the target mixture 614. The target location 605, which is also referred to as the irradiation site, is within an interior 607 of a vacuum chamber 630. When the amplified light beam 610 strikes the target mixture 614, a target material within the target mixture 614 is converted into a plasma state that has an element with an emission line in the EUV range. The created plasma has certain characteristics that depend on the composition of the target material within the target mixture 614. These characteristics can include the wavelength of the EUV light produced by the plasma and the type and amount of debris released from the plasma.

The light source 600 also includes a target material delivery system 625 that delivers, controls, and directs the target mixture 614 in the form of liquid droplets, a liquid stream, solid particles or clusters, solid particles contained within liquid droplets or solid particles contained within a liquid stream. The target mixture 614 includes the target material such as, for example, water, tin, lithium, xenon, or any material that, when converted to a plasma state, has an emission line in the EUV range. For example, the element tin can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 614 can also include impurities such as non-target particles. Thus, in the situation in which there are no impurities, the target mixture 614 is made up of only the target material. The target mixture 614 is delivered by the target material delivery system 625 into the interior 607 of the chamber 630 and to the target location 605.

The light source 600 includes a drive laser system 615 that produces the amplified light beam 610 due to a population inversion within the gain medium or mediums of the laser system 615. The light source 600 includes a beam delivery system between the laser system 615 and the target location 605, the beam delivery system including a beam transport system 620 and a focus assembly 622. The beam transport system 620 receives the amplified light beam 610 from the laser system 615, and steers and modifies the amplified light beam 610 as needed and outputs the amplified light beam 610 to the focus assembly 622. The focus assembly 622 receives the amplified light beam 610 and focuses the beam 610 to the target location 605.

In some implementations, the laser system 615 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 615 produces an amplified light beam 610 due to the population inversion in the gain media of the laser amplifiers even if there is no laser cavity. Moreover, the laser system 615 can produce an amplified light beam 610 that is a coherent laser beam if there is a laser cavity to provide enough feedback to the laser system 615. The term "amplified light beam" encompasses one or more of: light from the laser system 615 that is merely amplified but not necessarily a coherent laser oscillation and light from the laser system 615 that is amplified and is also a coherent laser oscillation.

The optical amplifiers in the laser system 615 can include as a gain medium a filling gas that includes $CO_2$ and can amplify light at a wavelength of between about 9100 and about 11000 nm, and in particular, at about 10600 nm, at a gain greater than or equal to 600. Suitable amplifiers and lasers for use in the laser system 615 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The optical amplifiers in the laser system 615 can also include a cooling system such as water that can be used when operating the laser system 615 at higher powers.

Figure 6B:
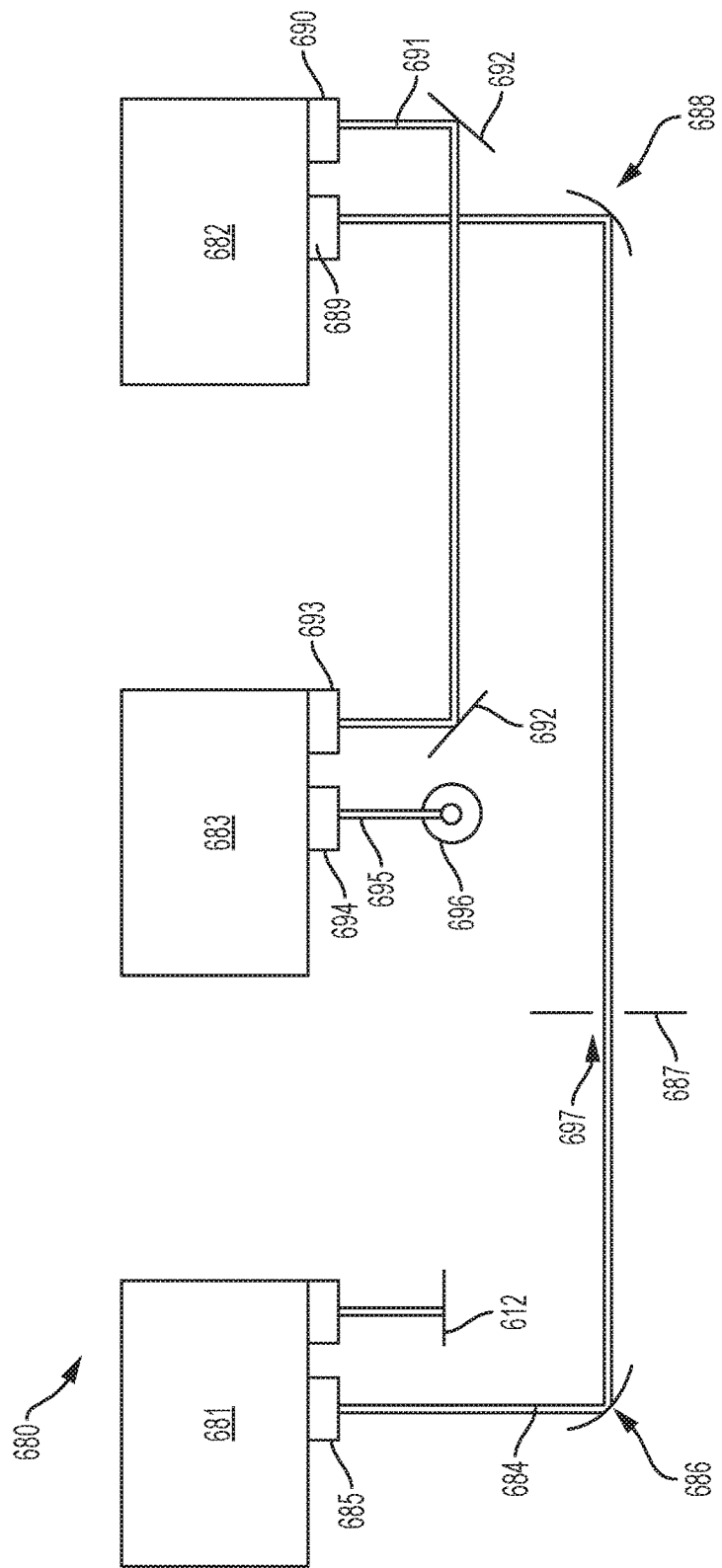
FIG. 6B is a block diagram of an example of a drive laser system that can be used in the light source of FIG. 6A.

FIG. 6B shows a block diagram of an example drive laser system 680. The drive laser system 680 can be used as the drive laser system 615 in the source 600. The drive laser system 680 includes three power amplifiers 681, 682, and 683. Any or all of the power amplifiers 681, 682, and 683 can include internal optical elements (not shown).

Light 684 exits from the power amplifier 681 through an output window 685 and is reflected off a curved mirror 686. After reflection, the light 684 passes through a spatial filter 687, is reflected off of a curved mirror 688, and enters the power amplifier 682 through an input window 689. The light 684 is amplified in the power amplifier 682 and redirected out of the power amplifier 682 through an output window 690 as light 691. The light 691 is directed toward the amplifier 683 with a fold mirror 692 and enters the amplifier 683 through an input window 693. The amplifier 683 amplifies the light 691 and directs the light 691 out of the amplifier 683 through an output window 694 as an output beam 695. A fold mirror 696 directs the output beam 695 upward (out of the page) and toward the beam transport system 620 (FIG. 6A).

Referring again to FIG. 6B, the spatial filter 687 defines an aperture 697, which can be, for example, a circle having a diameter between about 2.2 mm and 3 mm. The curved mirrors 686 and 688 can be, for example, off-axis parabola mirrors with focal lengths of about 1.7 m and 2.3 m, respectively. The spatial filter 687 can be positioned such that the aperture 697 coincides with a focal point of the drive laser system 680.

Referring again to FIG. 6A, the light source 600 includes a collector mirror 635 having an aperture 640 to allow the amplified light beam 610 to pass through and reach the target location 605. The collector mirror 635 can be, for example, an ellipsoidal mirror that has a primary focus at the target location 605 and a secondary focus at an intermediate location 645 (also called an intermediate focus) where the EUV light can be output from the light source 600 and can be input to, for example, an integrated circuit lithography tool (not shown). The light source 600 can also include an open-ended, hollow conical shroud 650 (for example, a gas cone) that tapers toward the target location 605 from the collector mirror 635 to reduce the amount of plasma-generated debris that enters the focus assembly 622 and/or the beam transport system 620 while allowing the amplified light beam 610 to reach the target location 605. For this purpose, a gas flow can be provided in the shroud that is directed toward the target location 605.

The light source 600 can also include a master controller 655 that is connected to a droplet position detection feedback system 656, a laser control system 657, and a beam control system 658. The light source 600 can include one or more target or droplet imagers 660 that provide an output indicative of the position of a droplet, for example, relative to the target location 605 and provide this output to the droplet position detection feedback system 656, which can, for example, compute a droplet position and trajectory from which a droplet position error can be computed either on a droplet by droplet basis or on average. The droplet position detection feedback system 656 thus provides the droplet position error as an input to the master controller 655. The master controller 655 can therefore provide a laser position, direction, and timing correction signal, for example, to the laser control system 657 that can be used, for example, to control the laser timing circuit and/or to the beam control system 658 to control an amplified light beam position and shaping of the beam transport system 620 to change the location and/or focal power of the beam focal spot within the chamber 630.

The target material delivery system 625 includes a target material delivery control system 626 that is operable, in response to a signal from the master controller 655, for example, to modify the release point of the droplets as released by a target material supply apparatus 627 to correct for errors in the droplets arriving at the desired target location 605.

Additionally, the light source 600 can include light source detectors 665 and 670 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 665 generates a feedback signal for use by the master controller 655. The feedback signal can be, for example, indicative of the errors in parameters such as the timing and focus of the laser pulses to properly intercept the droplets in the right place and time for effective and efficient EUV light production.

The light source 600 can also include a guide laser 675 that can be used to align various sections of the light source 600 or to assist in steering the amplified light beam 610 to the target location 605. In connection with the guide laser 675, the light source 600 includes a metrology system 624 that is placed within the focus assembly 622 to sample a portion of light from the guide laser 675 and the amplified light beam 610. In other implementations, the metrology system 624 is placed within the beam transport system 620. The metrology system 624 can include an optical element that samples or re-directs a subset of the light, such optical element being made out of any material that can withstand the powers of the guide laser beam and the amplified light beam 610. A beam analysis system is formed from the metrology system 624 and the master controller 655 since the master controller 655 analyzes the sampled light from the guide laser 675 and uses this information to adjust components within the focus assembly 622 through the beam control system 658.

Thus, in summary, the light source 600 produces an amplified light beam 610 that is directed along the beam path to irradiate the target mixture 614 at the target location 605 to convert the target material within the mixture 614 into plasma that emits light in the EUV range. The amplified light beam 610 operates at a particular wavelength (that is also referred to as a drive laser wavelength) that is determined based on the design and properties of the laser system 615. Additionally, the amplified light beam 610 can be a laser beam when the target material provides enough feedback back into the laser system 615 to produce coherent laser light or if the drive laser system 615 includes suitable optical feedback to form a laser cavity.

Figure 7A:
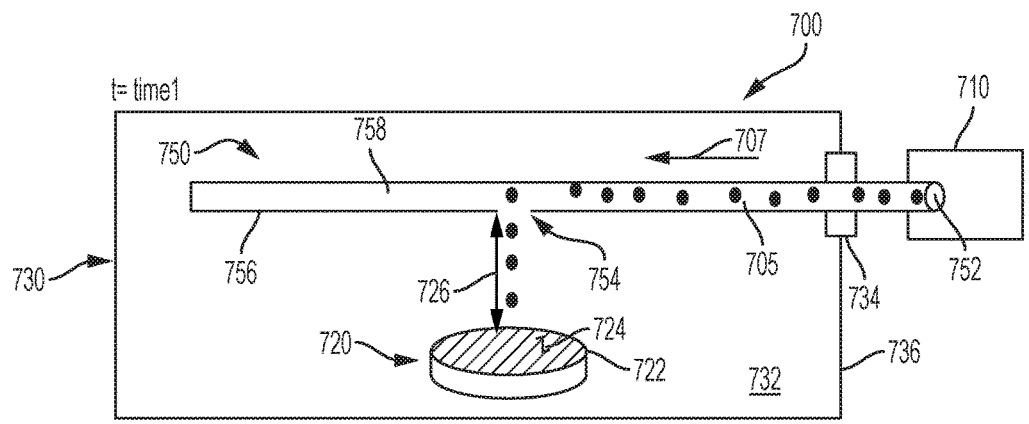
FIG. 7A-7C show a side view of an example of a free radical transport system at three different times.
Figure 7B:
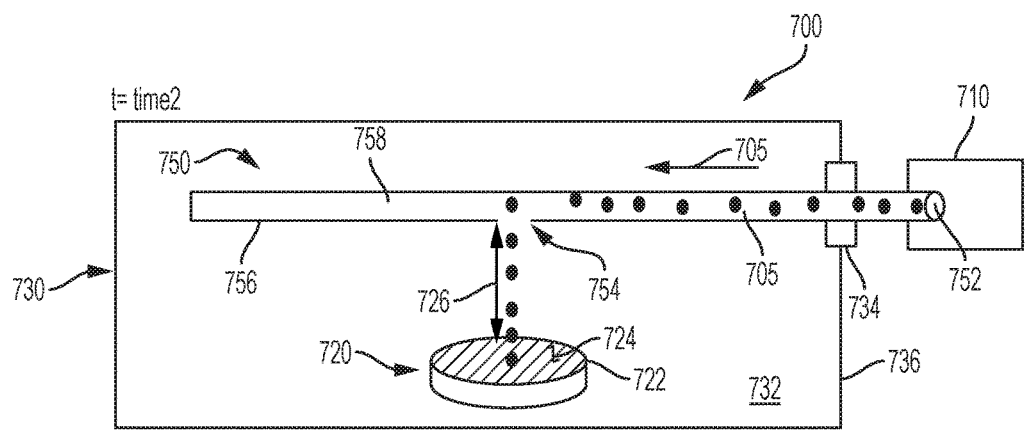
Figure 7C:
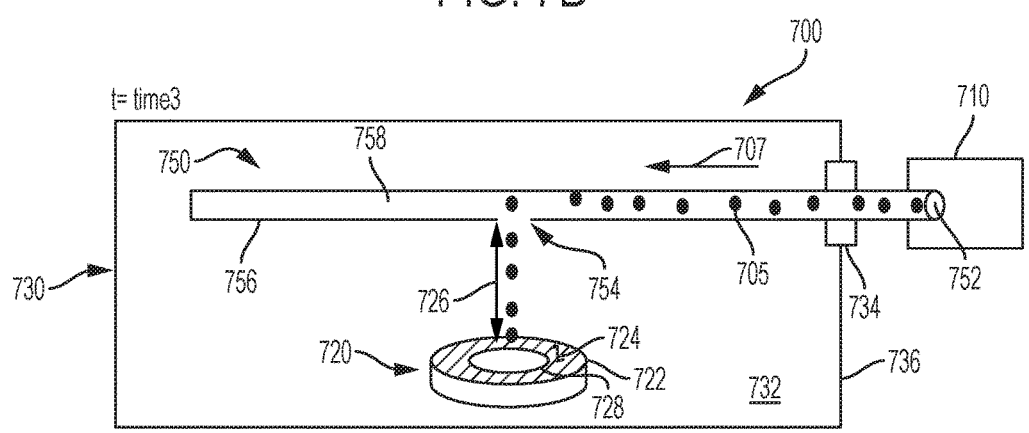

FIGS. 7A-7C show block diagrams of an example of a free radical transport system 700 at three different times, time1 (t1), time2 (t2), and time3 (t3), respectively. Time t1 is the earliest time, with time t2 occurring after time t1, and time t3 occurring after time t2. The free radical transport system 700 delivers free radicals 705 to an element 720 that is inside of a vessel 730. The free radical transport system 700 is also shown in FIG. 6A. Additionally, the free radical transport system 700 can be used in the system 200 (FIG. 2) as the fluid transport system 202.

The free radical transport system 700 includes a conduit 750 that connects to a source 710 of free radicals 705. The free radicals 705 flow into an opening 752 defined by the conduit 750 and travel in the conduit 750 along a direction 707. The conduit 750 also defines another opening 754 that passes through a sidewall 756 of the conduit 750 to provide a passage between an interior 758 of the conduit 750 and the interior 732 of the vessel 730. The vessel 730 can be a vacuum chamber, such as the vacuum chamber 630 discussed above. The element 720 can be any element that is exposed to debris that is generated in the interior 732 of the vessel 730. The element 720 can be an optical element that is in the path of plasma that is generated in the interior 732. For example, the element 720 can be a collector mirror, such as the collector mirror 635 of FIG. 6A.

Referring to FIG. 7A, the free radicals 705 travel from a source 710 through the conduit 750 in the direction 707 and exit through the opening 754 into the interior 732. The opening 754 is positioned so that the radicals 705 flow to the element 720 after exiting through the opening 754. For example, the opening 754 can be positioned to face a surface 722 of the element 720. The opening 754 is positioned a distance 726 from the surface 722. The distance 726 can be, for example, 15 to 30 cm. In the example shown, the conduit 750 includes the one additional opening 754, however, in other implementations, such as those shown in FIGS. 8A-8C and 10-16, a plurality of openings are formed in the conduit.

The element 720 is located in an interior 732 of the vessel 730. The conduit 750 passes through a sealed opening or port 734 in a wall 736 of the vessel 730. Thus, the conduit 750 transports the free radicals 705 from the external source 710 to the element 720. The free radicals 705 exit the conduit 750 through the opening 754 and pass into the interior 732.

Referring to FIG. 7B, the radicals 705 reach debris 724 that is on the surface 722. Continuing the example of the element 720 being in the path of plasma that is generated in the interior 732, the debris 724 can be contamination that originates from vapors, ions, particles, and/or clusters formed from a target mixture used to generate the plasma. The target mixture can be any material that emits EUV light when converted to plasma. Thus, the debris 724 can include vapor residue, particles, ions, or clusters of metal, such as tin, lithium, or any other substance that, when converted to a plasma, emits EUV light. As shown in FIG. 7C, the radicals 705 recombine with the debris 724 to remove the debris 724 from the surface 722. The recombination creates a cleaned region 728 that is free of the debris 724. The cleaned region 728 can be a circular area having a diameter of, for example, 6 inches (15.24 cm) or greater.

The conduit 750 is made of a material that does not react or combine with the free radicals or one that has a low recombination coefficient (for example, a recombination coefficient of about 5×10-3 or less). The recombination coefficient is a measure of the probability that a radical will recombine with another radical that resides on surface after a single collision with that surface. In the context of the free radicals 705 that travel through the conduit 750, the recombination coefficient of the material on an inner wall and the openings 752 and 754 determines, in part, the portion of radicals generated by the source 710 that reach the element 720. Materials that have a lower recombination coefficient allow a larger portion of the generated radicals 705 to reach the element 720 because relatively few of the free radicals 705 generated by the source 810 are lost by recombination through collisions with inner walls of the conduit 750.

The conduit 750 can be made of Teflon, quartz, or glass such as borosilicate glass (for example, Pyrex). In some implementations, the conduit 750 can be made of a metal that is coated, with a material that has a low recombination coefficient, at the portions that could come into contact with a free radical 705. For example, the conduit 750 can be an aluminum conduit having an interior surface and ends that are coated with glass, such as, for example, Pyrex. In another example, the conduit 750 can be made of an oxidized metal, such as silicon dioxide (SiO2), titanium oxide (TiO2), or aluminum oxide (AlO2). As yet another example, the conduit can be made of an anodized metal, such as anodized aluminum. Although a conduit made from a metal oxide can have a higher recombination coefficient than one made from a non-metallic material, a metal conduit can be relatively easier to machine and can be more rugged.

The material of the conduit 750 and the mass flow rate of the radicals 705 through the conduit allow the conduit 750 to be long enough to deliver the radicals 705 to the element 720 in-situ, that is, while the element is inside of the vessel 730. For example, the conduit 750 can have a longitudinal extent along the direction 707 of 0.8-2 meters.

Figure 8B:
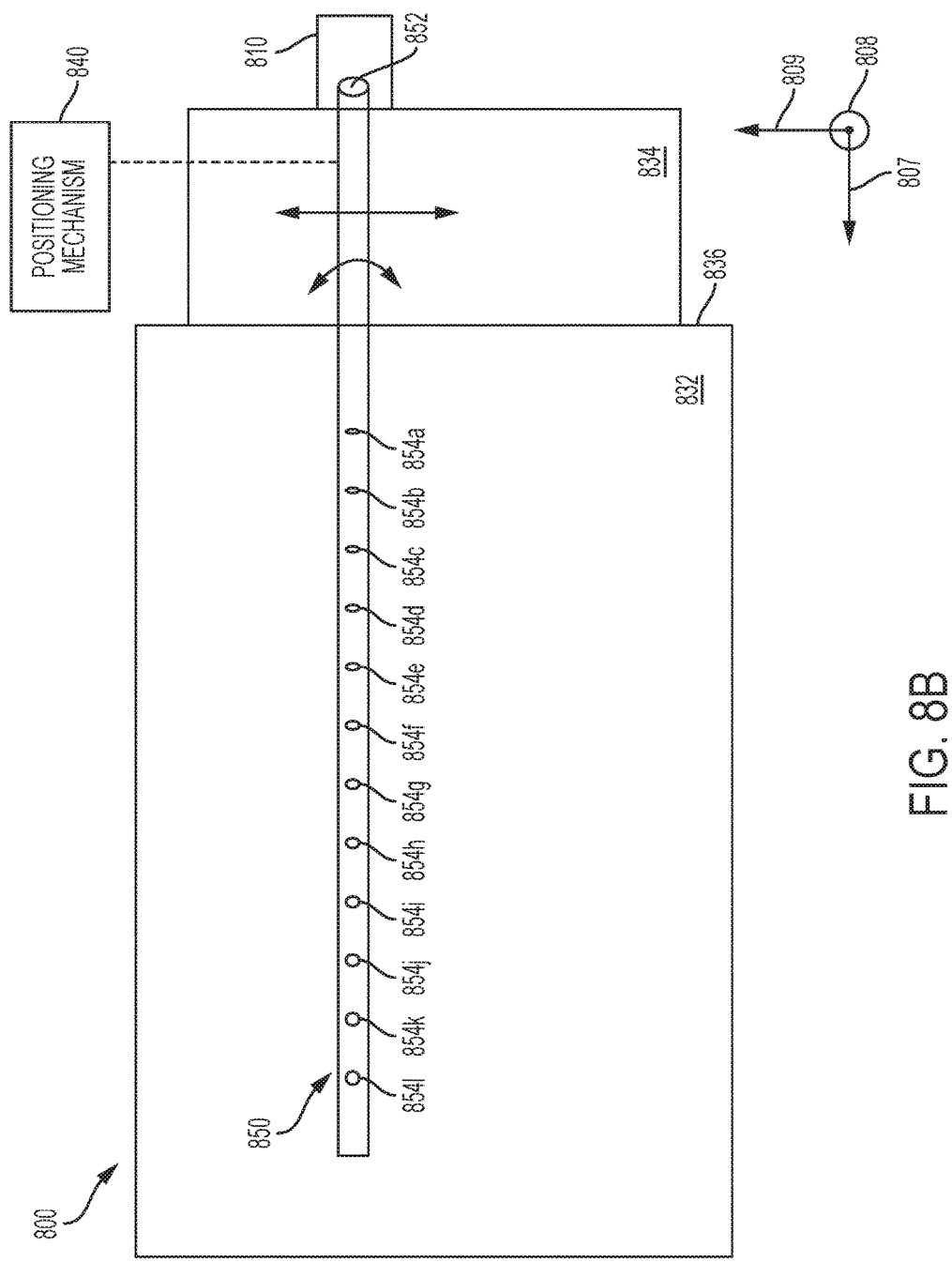
FIG. 8B is a view of the system of FIG. 8A taken along line 8B-8B.
Figure 8C:
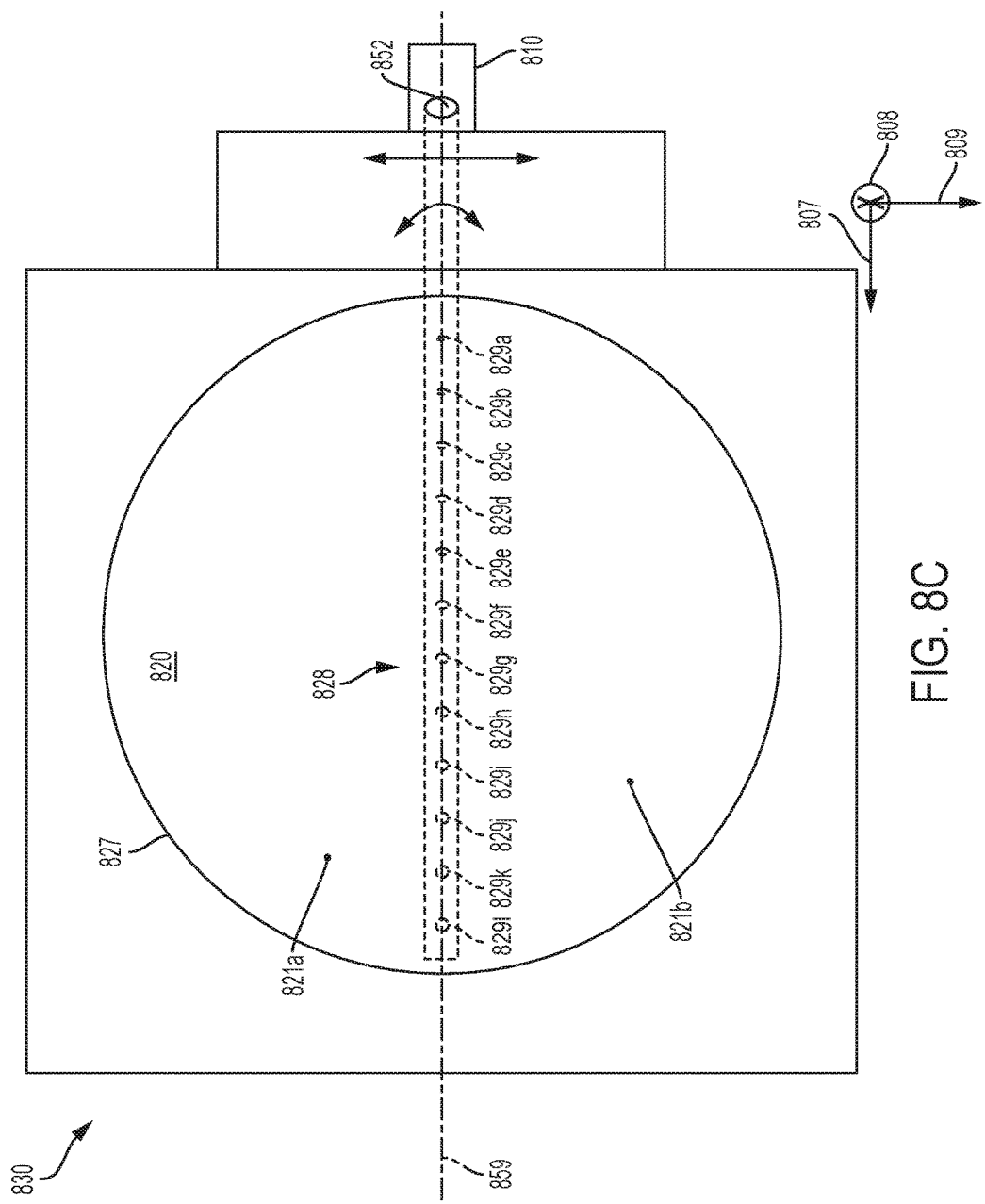
FIG. 8C is a view of the system of FIG. 8A taken along line 8C-8C.

Referring to FIGS. 8A-8C, a block diagram of another example of a free radical transport system 800 is shown. FIG. 8A shows a side view of the transport system 800, FIG. 8B shows a view of the transport system 800 taken along line 8B-8B of FIG. 8A, and FIG. 8C shows a view of the transport system 800 taken along line 8C-8C of FIG. 8A. The free radical transport system 800 can be used in the system 200 (FIG. 2) as the fluid transport system 202.

The free radical transport system 800 includes a conduit 850 that defines openings 854a-854l through which free radicals 805 exit the conduit 850 and are directed toward an element 820. The variable size and particular placement of the openings 854a-854l allows the system 800 to provide radicals to the element 820 at a uniform rate, thereby cleaning the element 820 at a uniform rate. The sizes of the openings 854a-854l increase in the direction 807, with the smallest opening (opening 854a) being closest to the source 810 and the largest opening (opening 854l) being farthest from the source 810.

Referring to FIG. 8A, the free radical transport system 800 includes a source 810 that produces the free radicals 805. FIG. 8A shows the conduit 850 from the side, with the openings 854a-854l oriented perpendicular to the direction 807, so that the free radicals 805 flow out of the openings 854a-854l in a direction 808 toward the element 820. The conduit 850 defines an opening 852 that couples to the source 810 and receives the generated free radicals 805. The conduit 850 passes through a sidewall 836 and a sealed port 834 of a vessel 830 (for example, a vacuum chamber) and into an interior 832 of the vessel 830. The free radicals 805 travel in a direction 807 in the conduit 850 and exit through the openings 854a-854l toward the element 820. The conduit 850 is located a distance 826 from the element 820. For an element, such as the element 820 that has a curved surface, that faces the conduit, the distance 826 is the largest distance from the conduit to the element. The distance 826 can be, for example, 15-30 cm.

The element 820 is in the interior 832 a vessel 830. The vessel 830 is part of an LLP EUV light source (such as the light source 600 of FIGS. 6A and 6B). The element 820 defines a surface 822 that is in the path of plasma that is generated in the vessel 830, and the plasma generation can cause debris 824 to form on the surface 822. The debris can include, for example, vapor residue, particles, and ions formed from tin droplets that are part of the target mixture used to generate the plasma.

When the radicals 805 reach the debris 824, the radicals 805 combine with the debris 824, thereby removing the debris 824 from the surface 822. Because the conduit 850 delivers the free radicals 805 to the element 820, there is no need to remove the element 820 from the vessel 830 for cleaning. Instead, the element 820 is cleaned while residing inside of the vessel 830. Cleaning the element 820 without removal from the vessel 830 reduces system downtime because, for example, the element 820 is not disturbed and does not have to be realigned after cleaning.

Referring also to FIGS. 8B and 8C, the conduit 850 includes openings 854*a*-854*l*, each of which forms a passage through a wall 856 of the conduit 850. FIG. 8B shows a view of the conduit 850 looking upward at the conduit 850 from the element 820, in a direction that is opposite to the direction 808. FIG. 8C shows a view looking downward onto the element 820, with the direction 808 going into the page. FIG. 8C also shows projections 829*a*-829*l* of each of the openings 854*a*-854*l*, respectively, on the surface 822 of the element 820. Together, the projections 829*a*-829*l* define a swath 828, which is the portion of the element 820 that is exposed to the free radicals 805 emitted from the openings 854*a*-854*l*.

The sizes of the openings 854*a*-854*l* increase in the direction 807, with the smallest opening (opening 854*a*) being closest to the source 810 and the largest opening (opening 854*l*) being farthest from the source 810. As discussed below, the increasing size of the openings 854*a*-854*l* in the direction 807 causes the free radicals 805 reach the swath 828 at a uniform rate.

The source 810 can be a microwave plasma generator. To produce free radicals with such a source, a gas from which the free radicals are formed is provided to the source 810. For example, to produce hydrogen radicals, hydrogen gas (H2) is provided. An additional gas can be added to the gas prior to providing the gas to the source 810. For example, a mixture of argon and oxygen (Ar/O2) can be added to the hydrogen gas. Both the hydrogen gas and the additional gas mixture have a mass flow rate and velocity when provided to the source 810. For example, the hydrogen gas can be provided to the source 810 at a mass flow rate of 3 standard liters per minute (SLM), and the Ar/O2 mixture can be provided to the source at a mass flow rate of 21 standard cubic centimeters per minute (SCCM).

The hydrogen and Ar/O2 gasses enter the source 810, are used to produce hydrogen free radicals and a moving gas that passes into the conduit 850 in the direction 807. The moving gas that travels in the conduit gives rise to a back pressure that acts along a direction opposite from the direction 807. The back pressure is a resistance that is encountered by the moving gas as it flows through the conduit 850.

When present, back pressure has the effect of reducing the mass flow rate or velocity of the gas that travels in the conduit 850, which, in turn, causes the free radicals carried by the gas to stay in the conduit 850 for a longer period of time. The time that the free radicals 805 are in the conduit 850 is the "residence time." The presence of back pressure can result in a higher residence time for the hydrogen radicals, and the higher residence time leads to more opportunities for the radicals to recombine with the interior walls of the conduit 850 and fewer hydrogen radicals reaching the element 820.

Increasing the mass flow rate or velocity of the gas flowing in the conduit 850 in the direction 807 can also increase the speed at which the free radicals 805 travel in the conduit 850 quickly, thereby delivering the free radicals to the element 820 at a higher rate and cleaning the element 820 more quickly. However, increasing the mass flow rate or velocity of the flowing gas also can increase the back pressure, which can lower the amount of free radicals delivered to the element 820 (through increased recombination during the radicals' increased residence time in the conduit) and can also lower the speed at which the radicals are delivered to the element 820 (through the reduced velocity of the flowing gas caused by the back pressure). As such, increases in the mass flow rate or velocity of the gas flowing in the conduit 850 are balanced against the creation of back pressure.

Additionally, in a conduit that lacks openings in a sidewall, the pressure or resistance encountered by gas flowing in the conduit can increase in the direction of gas flow. If the openings in the sidewalls are all the same size, more radicals 805 exit from the opening closest to the source than any other opening because the pressure inside the conduit 850 is increased towards the source 810. Further, in this situation, the radicals 805 decrease in velocity as they move through the conduit 850 in the direction 807 because of the reducing or decreasing mass flow in the direction 807. As a result, if all of the openings in the conduit sidewall are the same size, radicals 805 reach the swath 828, but the velocity of the radicals 805 reaching the swath 828 may not be constant throughout the various portions of the swath 828.

In contrast, the openings 854*a*-854*l* of the conduit 850 have different sizes, and the sizes of the openings increase in the direction of the gas flow (the direction 807). This arrangement reduces the effect discussed above. Thus, when a conduit that has variable sized openings in a sidewall, such as the conduit 850, is used to deliver the radicals 805 to the surface 822, all of the portions of the swath 828 are cleaned at the same rate.

In some implementations, the backpressure in the conduit is kept below 0.9-1.2 torr, and the centerline mass flow rate of the flowing gas in the direction 807 is between 1-4 SLM. The etch rate or rate of removal of the debris 824 can be, for example, 5-125 nanometers per minute (nm/min). The rate of removal can be greater than 125 nm/min. The centerline mass flow rate of the flowing gas in the direction 807 can be defined by a flow pattern. Thus, by applying different flow patterns to the transport system 800, the centerline mass flow rate can be varied.

The openings 854*a*-854*l* can have circular cross sections with diameters of 4.5-6.5 mm and can be spaced equidistant from each other on the conduit 850 in the direction 807. The longitudinal spacing between each of the openings along the direction 807 can be, for example, 40 mm. Although the example shown in FIGS. 8A-8C includes twelve openings, in other examples, more or fewer openings can be used. For example, the conduit 850 can define ten openings or more than twelve openings.

Referring to FIGS. 8B and 8C, to enlarge the area on the element 820 that is cleaned, the conduit 850 can be rotated about a longitudinal axis 859 that is defined by the conduit 850 and extends along a direction that is parallel to the direction 807. Alternatively or additionally, the conduit 850 can be translated back and forth along a direction 809.

Furthermore, the conduit 850 can be moved in the direction 808 to bring the conduit 850 closer to the element 820 or in the direction opposite to the direction 808 to move the conduit 850 further from the element 820. Moving the conduit 850 closer to the element 820 can allow a larger portion of the free radicals 805 to reach a particular region of the surface 822 of the element 820. For example, the conduit 850 can be moved toward the surface 822 in the direction 308 to direct free radicals 850 toward a stagnation region. Moving the conduit 850 further from the surface 822 of the element 820 can enlarge the area that is cleaned by the free radicals 850. The motion of the conduit 850 can be specified in a flow pattern that defines how the free radicals 850 are directed toward the surface 822.

The system 800 includes a positioning mechanism 840 that allows a user of the system 800 to move the conduit 850. The positioning mechanism 840 can be configured for manual operation, for example, with a lever, wheel, or other mechanical device that is accessible from outside of the vessel 830 and allows the user to move the conduit 850. The positioning mechanism 840 can be computer controlled. For example, the conduit 850 can be coupled to a stepper motor or other device that moves the conduit 850 when activated by a user or an automated electronic process. When the transport system 800 is used as the fluid transport system 203 (FIG. 2), the positioning mechanism 840 is part of or controlled by the conduit controller 240.

Translation of the conduit 850 back and forth along the direction 809 moves the conduit 850 relative to the element 820 while keeping the distance 826 (FIG. 8A) constant. In other words, the conduit 850 moves relative to the element 820 in a plane that is parallel to a plane that includes a perimeter or edge 827 of the element 820. Rotating the conduit 850 about the axis 859 allows the free radicals 805 to be delivered to regions of the element 820 that are outside of the swath 828, such as the regions 821a and 821b. Translating the conduit 850 back and forth along the direction 809 also allows free radicals 805 to be delivered to regions of the element 820 that are outside of the swath 828.

Figure 9:
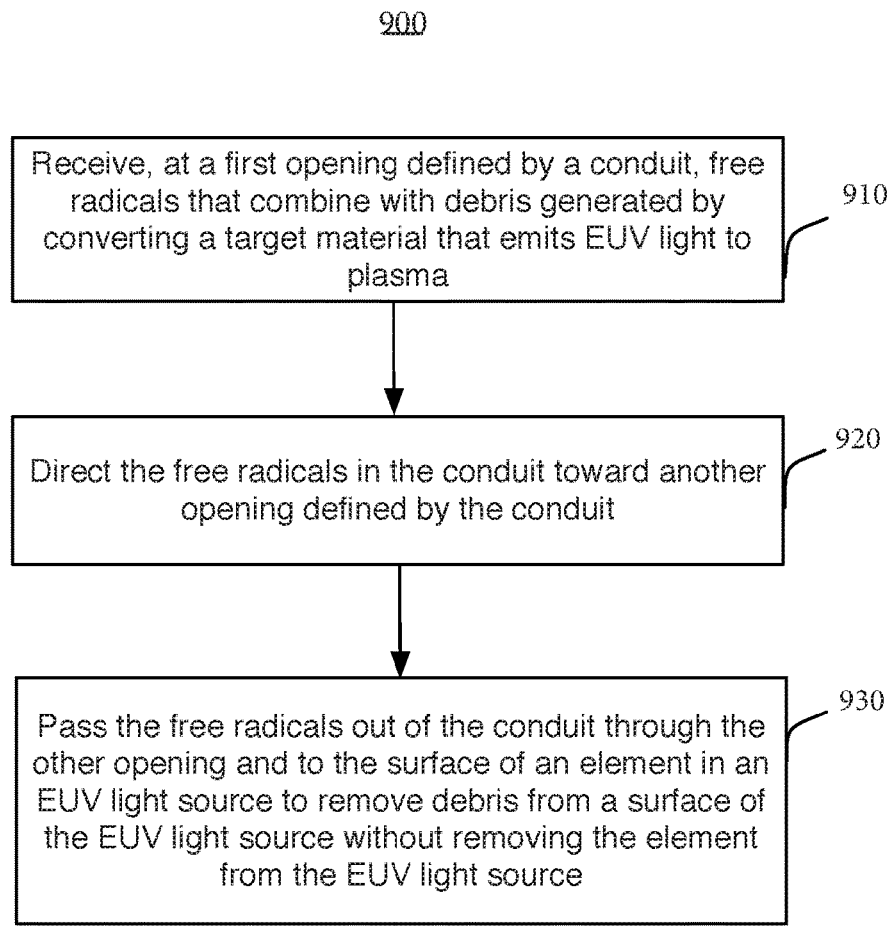
FIG. 9 is a flow chart of an example process for cleaning an element.

Referring to FIG. 9, a flow chart of an example process 900 for cleaning an optical element in a vacuum chamber of an EUV light source without removing the element from the vacuum chamber is shown. The process 900 can be performed with any free radical transport system disclosed herein. For example, the process 900 can be performed with the transport system 700 or 800. In the discussion of the process 900, the system 800 is used as an example.

Referring again to FIGS. 8A-8C, free radicals 805 are received at the first opening 852 defined by the conduit 850 (910). The free radicals combine with debris on an element to be cleaned. The debris can be generated when a target mixture is converted to plasma that emits EUV light, and the debris can accumulate on a surface of the element by virtue of the element being in the path of the plasma. The free radicals 805 are generated by the source 810. The source 810 can be, for example, a microwave plasma generator, such as the SMART POWER GENERATOR available from MKS Instruments, Inc. of Andover, Mass. The source can be operated at, for example, 8000 Watts.

To generate the free radicals, a gas that is capable of being dissociated into free radicals is provided to the source 810. The gas can be or include, for example, hydrogen ($H_2$), hydrogen iodide (HI), bromine ($Br_2$), chlorine ($Cl_2$), iodine, ($I_2$), methane, or water. An additional gas (such as a mixture of argon and oxygen) can be added before providing the mixture to the source 810. The gas is provided to the source 810 at a mass flow rate or velocity, and the free radicals generated at the source 810 flow into the conduit 850 with a gas flow from the source 810. The mass flow rate or velocity can be defined by a flow pattern stored in the flow pattern store 246. Thus, the mass flow rate or velocity can be varied through selection of a particular flow pattern.

The opening 852 and the portions of the conduit 850 that transport or are otherwise in the path of the free radicals 805 are made from a material that has a low recombination coefficient. The opening 852 is coupled to an applicator of the microwave plasma generator so that the opening 852 receives the free radicals 805. The applicator of the microwave plasma generator can be made of sapphire, and the conduit 850 and the opening 852 can couple to the sapphire applicator so that the free radicals do not encounter any metal surfaces while flowing from the source 810 into the conduit 850. Such an arrangement can help reduce radical loss at the coupling.

The free radicals 805 in the conduit 850 are directed toward the openings 854a-854l (920). The free radicals 805 can be directed toward the openings 854a-854l by the gas that flows from the source 810 in the conduit 850. Additionally or alternatively, the pressure in the interior 832 of the vessel 830, which is where the openings 854a-854l provide a passage to, is lower than the pressure at the source 810 and in the conduit 850. For example, the pressure in the inside of the vessel 830 can be 300 mtorr (40 pascals). As a result, the free radicals 805 are drawn from the conduit 850, through the openings 854a-854l, and into the interior 832.

As discussed above, to help promote transport of the radicals, the conduit 850 is made from a material that has a low recombination rate with the free radicals that flow into the conduit 850. Additionally, the mass flow rate or velocity of the gas that carries the radicals in the conduit is increased as much as possible while minimizing the effects of back pressure. Increasing the velocity at which the free radicals 805 move in the conduit 850 also reduces the amount of time the free radicals 805 are in the conduit 850, lessening the amount of radical loss that is attributable to collisions with the interior walls of the conduit 850. Increasing the velocity of the free radicals 805 also increases the rate of cleaning of the element. In some implementations, the free radicals 805 travel in the conduit 850 at a constant mass flow rate of 1-4 SLM over the longitudinal extent of the conduit 850. The longitudinal extent of the conduit 850 can be, for example, 0.8-2 meters.

The free radicals 805 are passed through at least one of the openings 854a-854l and toward the surface 822 of the element 820 (930). As discussed above a pressure differential between the interior 832 of the vessel 830, the source 810, and the interior of the conduit 850, with the pressure being lowest in the vessel 830, can cause the free radicals 805 to pass through the openings 854a-854l. The openings 854a-541 are oriented towards the swath 828 and direct the free radicals 805 to the swath 828. The radicals 805 combine with debris 824 on the swath 828 and remove the debris 824. The radical can combine with the debris by, for example, etching, combusting, or reacting with the debris 824. The radicals 805 can remove the debris at a rate of 5-125 nm/min.

In some implementations, such as shown in FIGS. 8B and 8C, the openings 854a-3541 can be oriented toward the element 820 by rotating and/or translating the conduit 850 so that the openings 854a-3541 are pointed toward a particular part of the element 820.

FIGS. 10-13 show other example conduits 1050-1350, respectively. Any of the conduits shown in FIGS. 10-13 can be used in the transport system 700 or 800 or as the conduit 250 in the fluid transport system 202.

Figure 10:
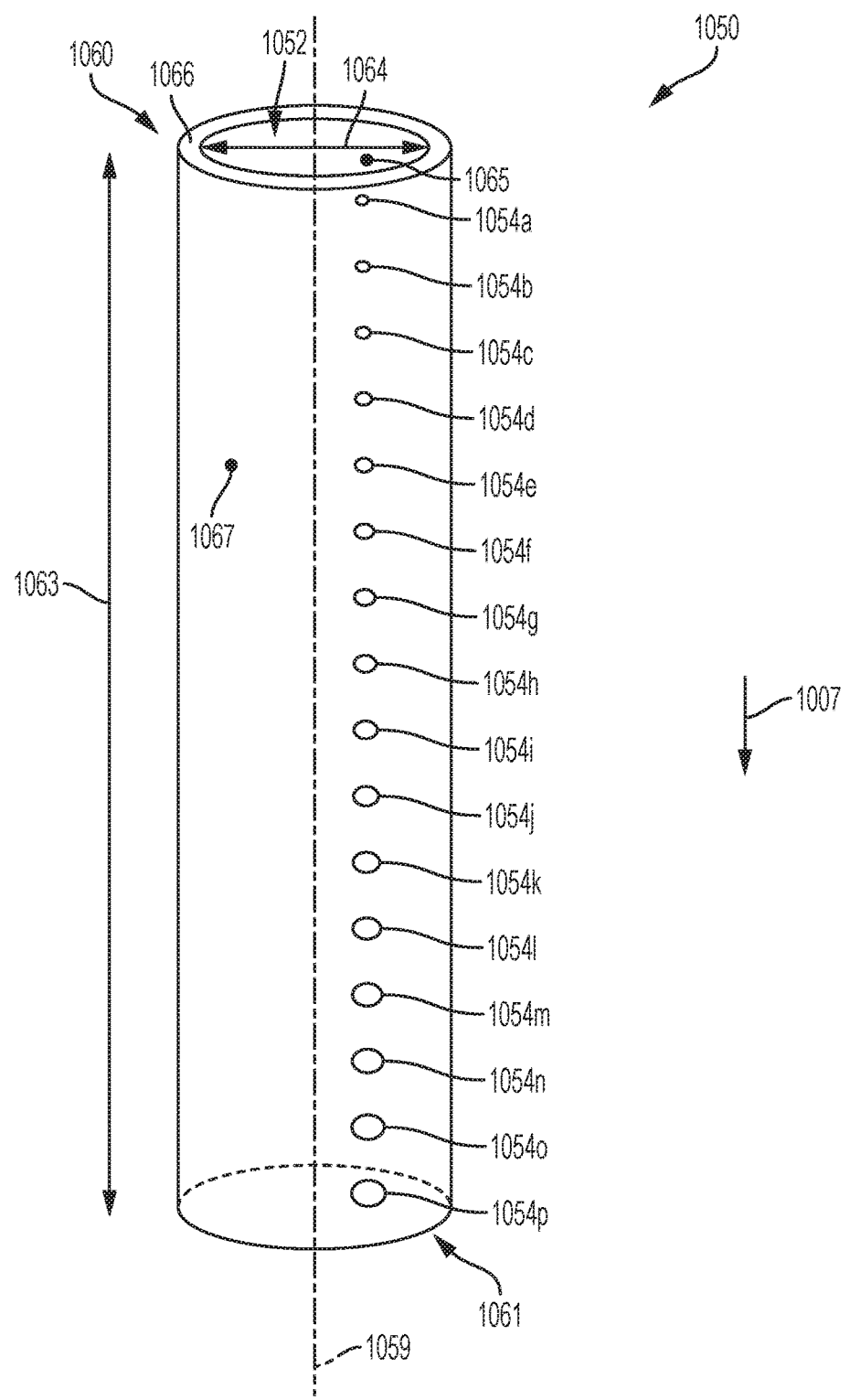
FIGS. 10-12 and 13A are perspective views of examples of conduits for transporting free radicals.

Referring to FIG. 10, an example conduit 1050 is shown. The conduit 1050 defines a longitudinal axis 1059 and two ends, a source end 1060 and a vessel end 1061. The conduit 1050 has a longitudinal extent 1063 that is the distance between the source end 1060 and the vessel end 1061 in a direction that is parallel to the longitudinal axis 1059. The extent 1063 can be 0.8-2 m. For example, the extent 1063 can be 0.8 m, 0.9 m, 0.95 m, 0.975 m, or 1 m. The conduit 1050 has a wall 1067 that defines an outer surface 1056, an inner surface 1065, and a rim 1066. The rim 1066 of the source end defines an opening 1052 that has a diameter of 1064. The diameter 1064 can be, for example 2.5 cm.

The wall 1067 defines openings 1054a-1054p, each of which pass through the wall 1067 to form a passage that allows fluid and free radicals to pass from an interior of the conduit 1050 to an exterior of the conduit 1050. The size of the openings 1054a-1054p can vary, with the size increasing along the direction 1007. That is, the opening 1054a is the smallest opening, and the opening 1054p is the largest opening. The openings 1054a-1054p can be circular in cross section, and can have diameters ranging between 4.5-6.5 mm. The openings can be spaced from each other 20-40 mm in the direction 1007. Further, the conduit 1050 can have more or fewer openings than the example shown in FIG. 10.

The rim 1066 and the inner surface 1065 are made from and/or coated with a material that has a low recombination coefficient. The rim 1066 and the inner surface 1065 can be or be coated with, for example, Pyrex, quartz, glass, a native oxide (such as silicon dioxide or titanium dioxide), or an anodized metal, such as anodized aluminum. The rim 1066 and the inner surface 1065 can be any material that has a recombination coefficient of about $5 \times 10^{-3}$ or less. In this manner, the rim 1066 and the inner surface 1065 recombine with relatively few free radicals, instead transporting the free radicals through the conduit and delivering the free radicals to an element to be cleaned. In other cases, material with a recombination coefficient of $1 \times 10^{-2}$ or higher can also be used with a corresponding decrease in the cleaning rate.

In use, the source end 1060 is coupled to a source of free radicals and receives free radicals at the opening 1052. For example, the source end 1060 can be coupled to an applicator of a microwave plasma generator. The applicator of a microwave plasma generator is an element that converts microwave energy to plasma. The applicator of a microwave plasma generator can be a tube that is made of, for example, sapphire. Coupling the sapphire applicator tube to the opening 1052 allows the free radicals generated by the source to flow into the conduit 1050 without encountering metal or other elements that recombine with the free radicals. As a result, the coupling of the conduit 1050 to the source results in the loss of few, if any, free radicals. The free radicals travel into the conduit 1050 from the source and exit the conduit through the holes 1054a-1054p.

Figure 11:
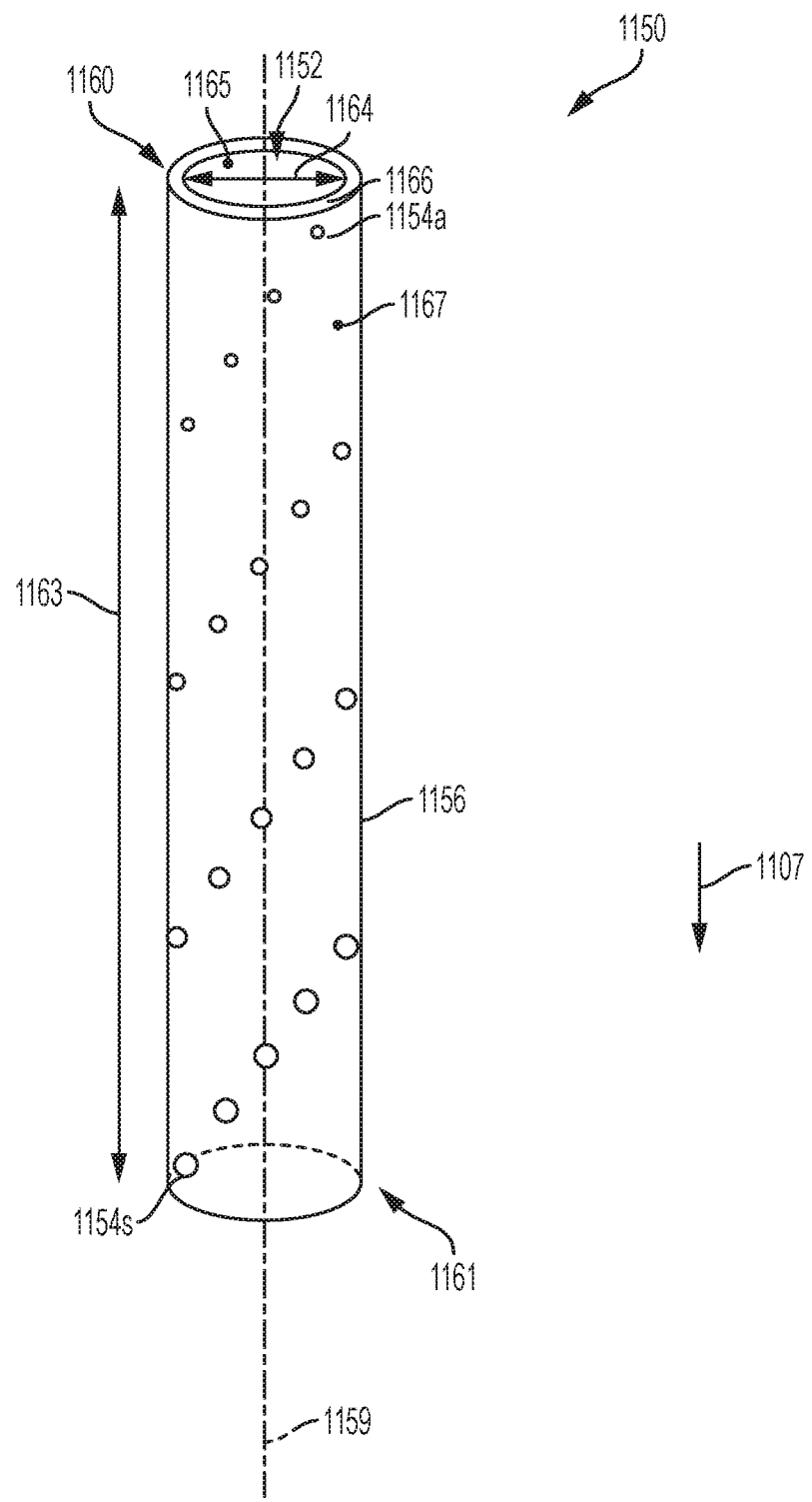
Figure 12:
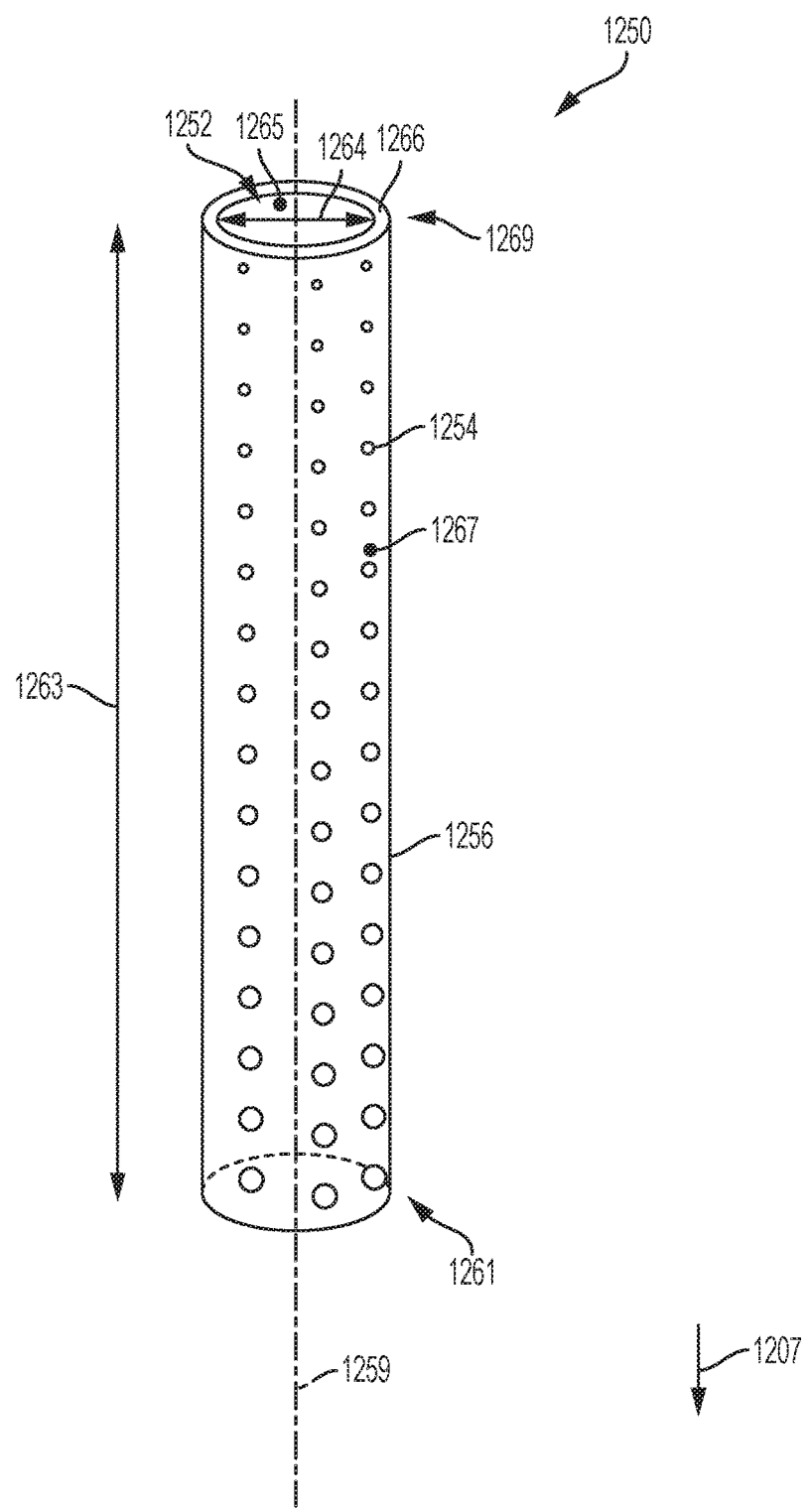

FIGS. 11 and 12 show other example conduits 1150 and 1250, respectively. The conduits 1150 and 1250 can be used in any of the transport systems disclosed herein, for example the system 700 or 800 or the system 200 discussed above.

The conduits 1150 and 1250 are similar to the conduit 1050, except the conduits 1150 and 1250 have openings that are offset at different angles by being positioned to pass through different points on a sidewall 1167, 1267 of the conduit 1150, 1250. The positioning causes the radicals that are emitted from the conduits 1150 and 1250 to be emitted over a larger area of the element to be cleaned. In other words, when projected on to the element to be cleaned, the openings of the conduits 1150 and 1250 cover a larger area than the openings of a conduit that has openings that are all oriented at the same angle relative to the element to be cleaned. An example of such a conduit is one in which all of the openings are aligned along a line that is parallel to a longitudinal axis of the conduit (such as the conduit 1050).

Referring to FIG. 11, the conduit 1150 has a source end 1160 and a vessel end 1161. The conduit 1150 has a wall 1167 that defines a longitudinal axis 1159, an outer surface 1156, an inner surface 1165, and a rim 1166. The rim 1166 of the source end 1160 defines an opening 1152 that has a diameter of 1164. The diameter 1164 can be, for example 2.5 cm. The wall also defines openings 1154a-1154s. The openings 1154a-1154s are arranged in a spiral arrangement on the wall 1157. The openings 1154a-1154s can be arranged on only one half of the conduit, as shown in FIG. 11. In other implementations, the openings 1154a-1154s can be arranged on the surface of the entire conduit 1150, so that radicals are emitted from the conduit 1150 in all directions.

The conduit 1150 has an extent 1163 in a direction that is parallel to the longitudinal axis 1159. The extent 1163 can be 0.8-2 m. For example, the extent 1163 can be 0.8 m, 0.9 m, 0.95 m, 0.975 m, or 1 m. Similar to the conduit 1050, the inner surface 1165 and the rim 1166 of the conduit 1150 are a material that has a low recombination coefficient.

Referring to FIG. 12, the conduit 1250 has a source end 1260 and a vessel end 1261. The conduit 1250 has a wall 1267 that defines a longitudinal axis 1259, an outer surface 1256, an inner surface 1265, and a rim 1266. The rim 1266 of the source end 1260 defines an opening 1252 that has a diameter of 1264. The diameter 1264 can be, for example 2.5 cm. The wall also defines a plurality of openings 1254, each of which provides a passage between the interior and exterior of the conduit 1150 for radicals and gas. The openings 1254 are arranged in columns that extend parallel to the longitudinal axis 1259. The openings 1254 have different sizes, with the sizes increasing in the direction 1207. The example conduit 1250 shown in FIG. 12 has three columns of openings. However, more or fewer columns of openings can be used.

The conduit 1250 has an extent 1263 in a direction that is parallel to the longitudinal axis 1259. The extent 1263 can be 0.8-2 m. For example, the extent 1263 can be 0.8 m, 0.9 m, 0.95 m, 0.975 m, or 1 m. Similar to the conduit 1050, the inner surface 1265 and the rim 1266 of the conduit 1250 are a material that has a low recombination coefficient.

Figure 13A:
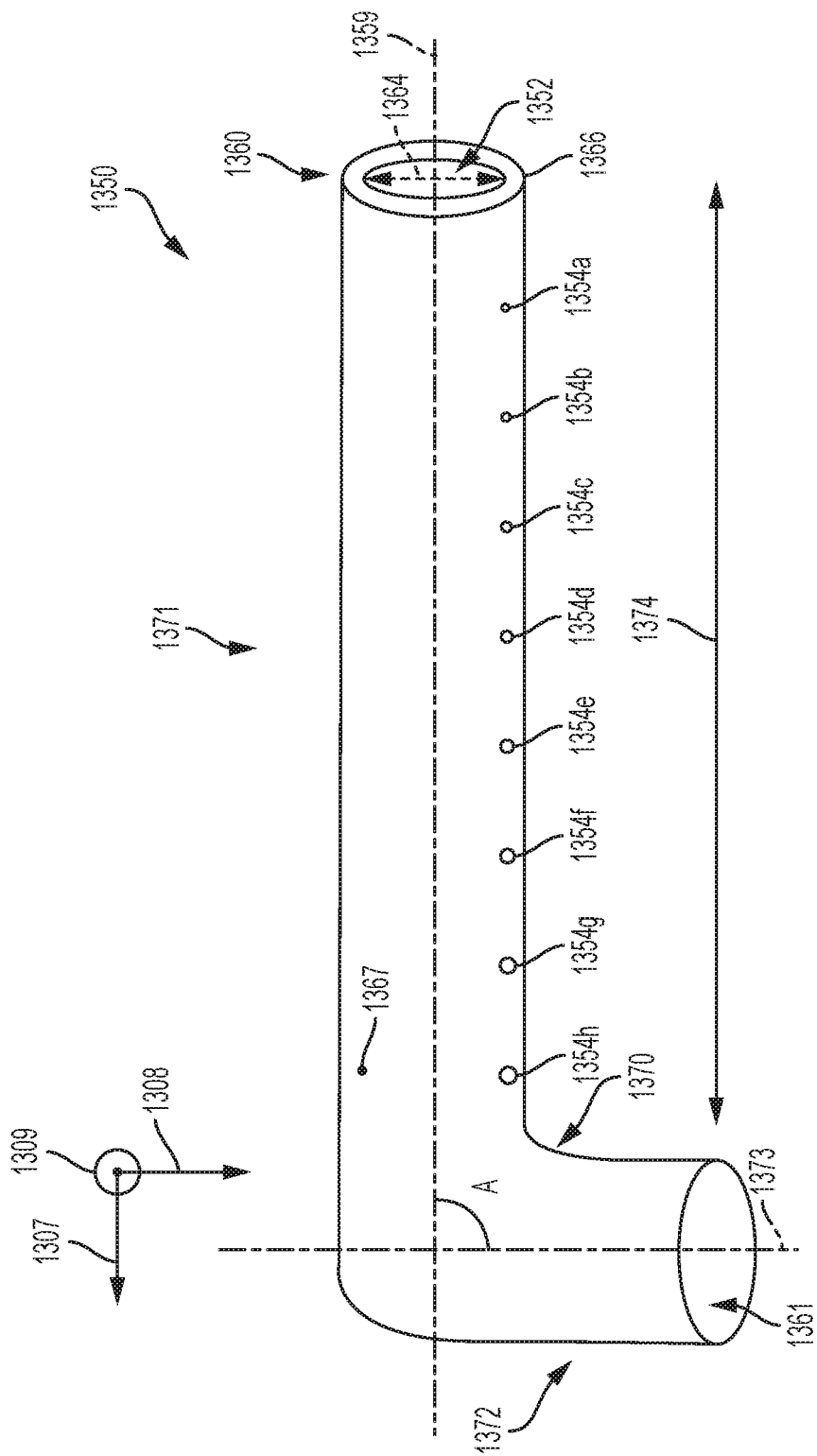
Figure 13B:
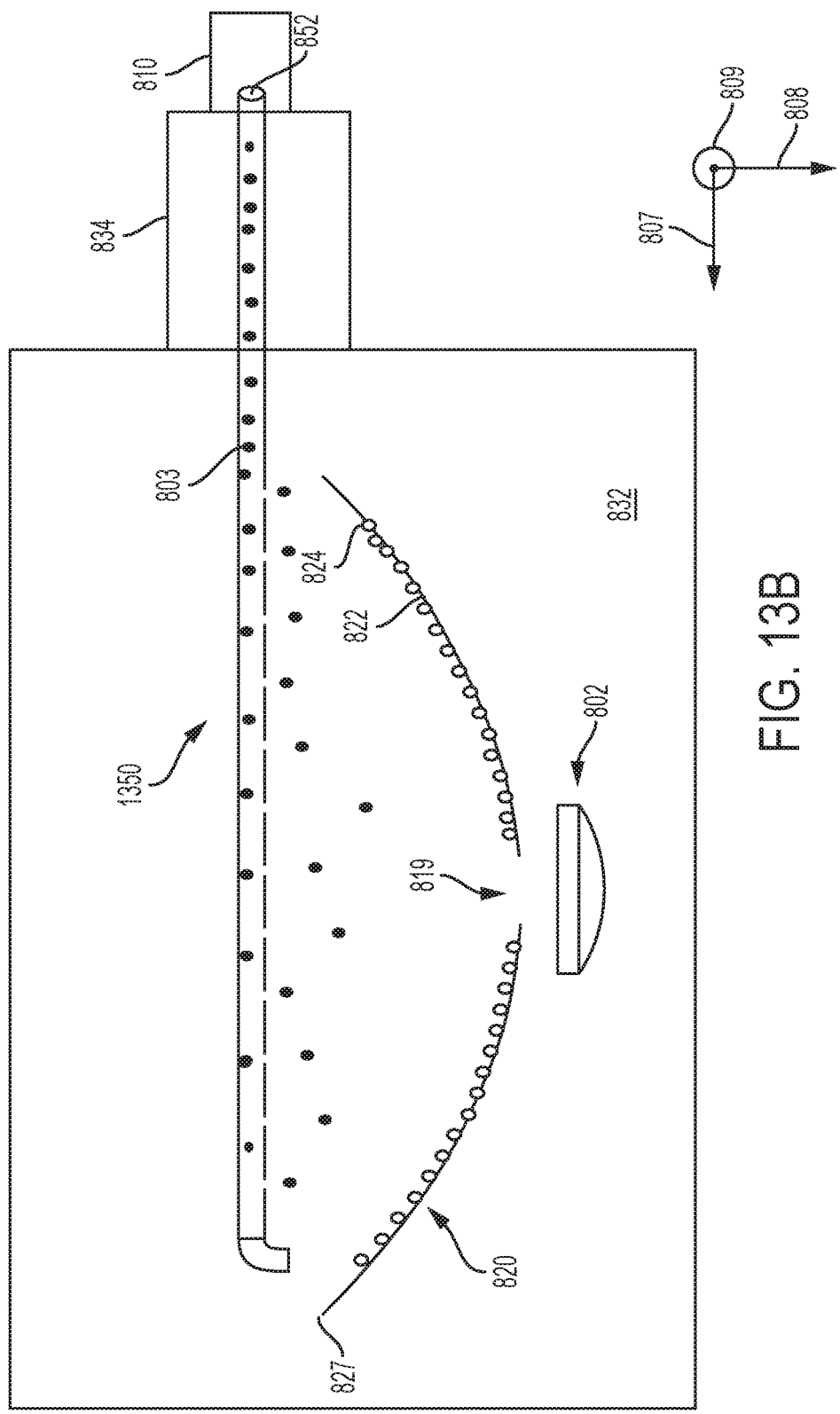
FIG. 13B is a side view of an example of free radical transport system.

Referring to FIG. 13A, another example conduit 1350 is shown. The conduit 1350 can be used as a conduit in any of the transport systems disclosed herein. For example, and referring also to FIG. 13B, the conduit 1350 can be used in place of the conduit 850 in the transport system 800. The conduit 1350 is similar to the conduit 1050, except that the conduit 1350 has a radius of curvature 1370. Because of the radius of curvature, the conduit 1350 has a linear portion 1371 that defines a longitudinal axis 1359, and a curved portion 1372 that bends away from the linear portion 1371 and extends along an axis 1373. The radius of curvature 1370 can be any curvature such that the angle "A" between the longitudinal axis 1359 and the axis 1373 is greater than 0 degrees (°) and no more than 90°.

The conduit 1350 includes a source end 1360 and a vessel end 1361. The conduit has an extent 1374 along a direction 1307 that is parallel to the longitudinal axis 1359. The extent 1374 can be 0.8 m, 0.9 m, 0.95 m, 0.975 m, or 1 m.

The conduit 1350 has a wall 1367 that defines a longitudinal axis 1359, an outer surface 1356, an inner surface 1365, and a rim 1366. The rim 1366 of the source end 1360 defines an opening 1352 that has a diameter of 1364. The diameter 1364 can be, for example 2.5 cm. The wall also defines a plurality of openings 1354, each of which provides a passage between the interior and exterior of the conduit 1350 for radicals and gas. The openings 1354 have different sizes, with the sizes increasing in the direction 1307.

Similar to the conduit 1050, the inner surface 1365 and the rim 1366 of the conduit 1350 are a material that has a low recombination coefficient.

Figure 14A:
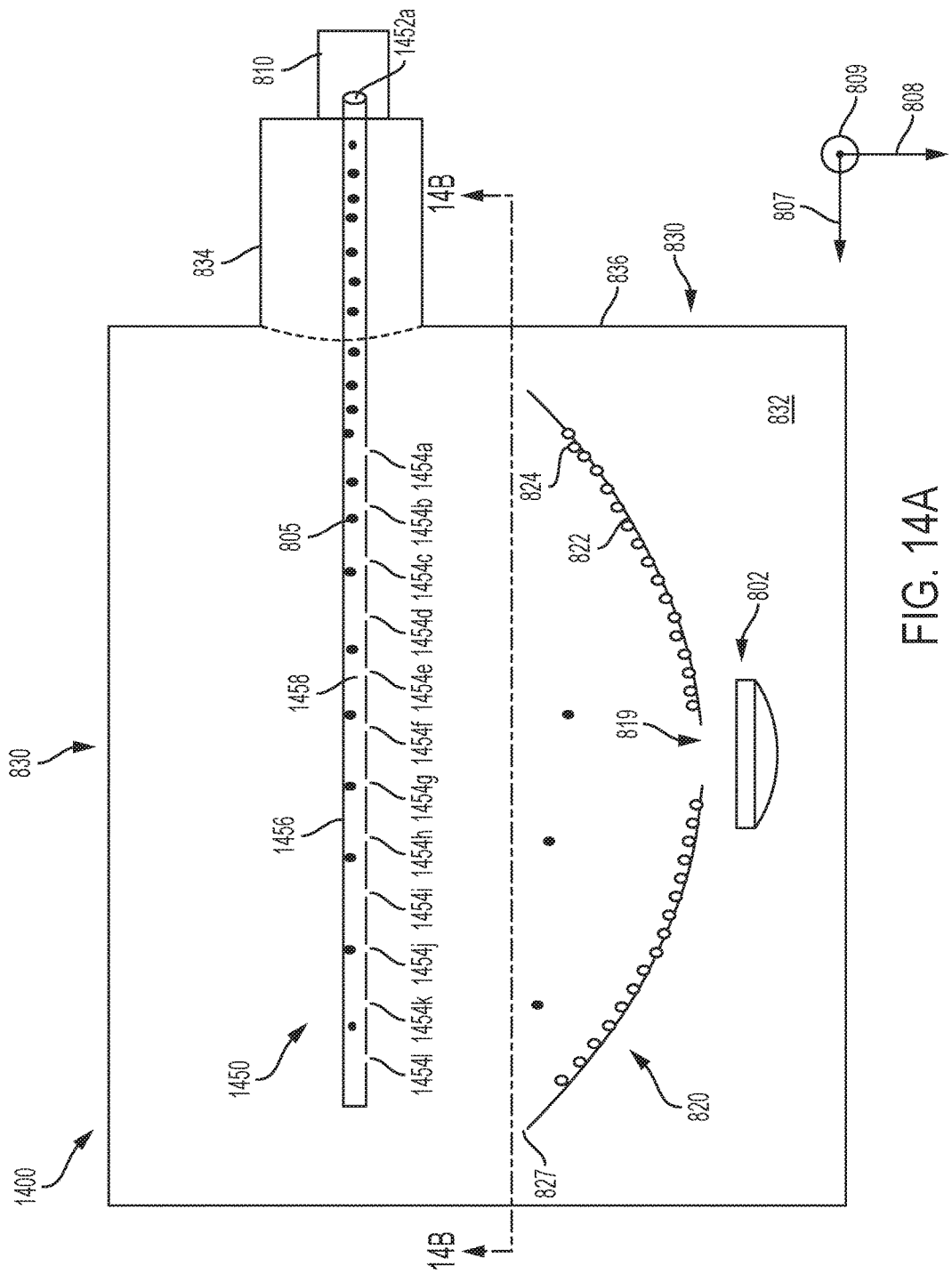
FIG. 14A is a side view of an example of free radical transport system.
Figure 14B:
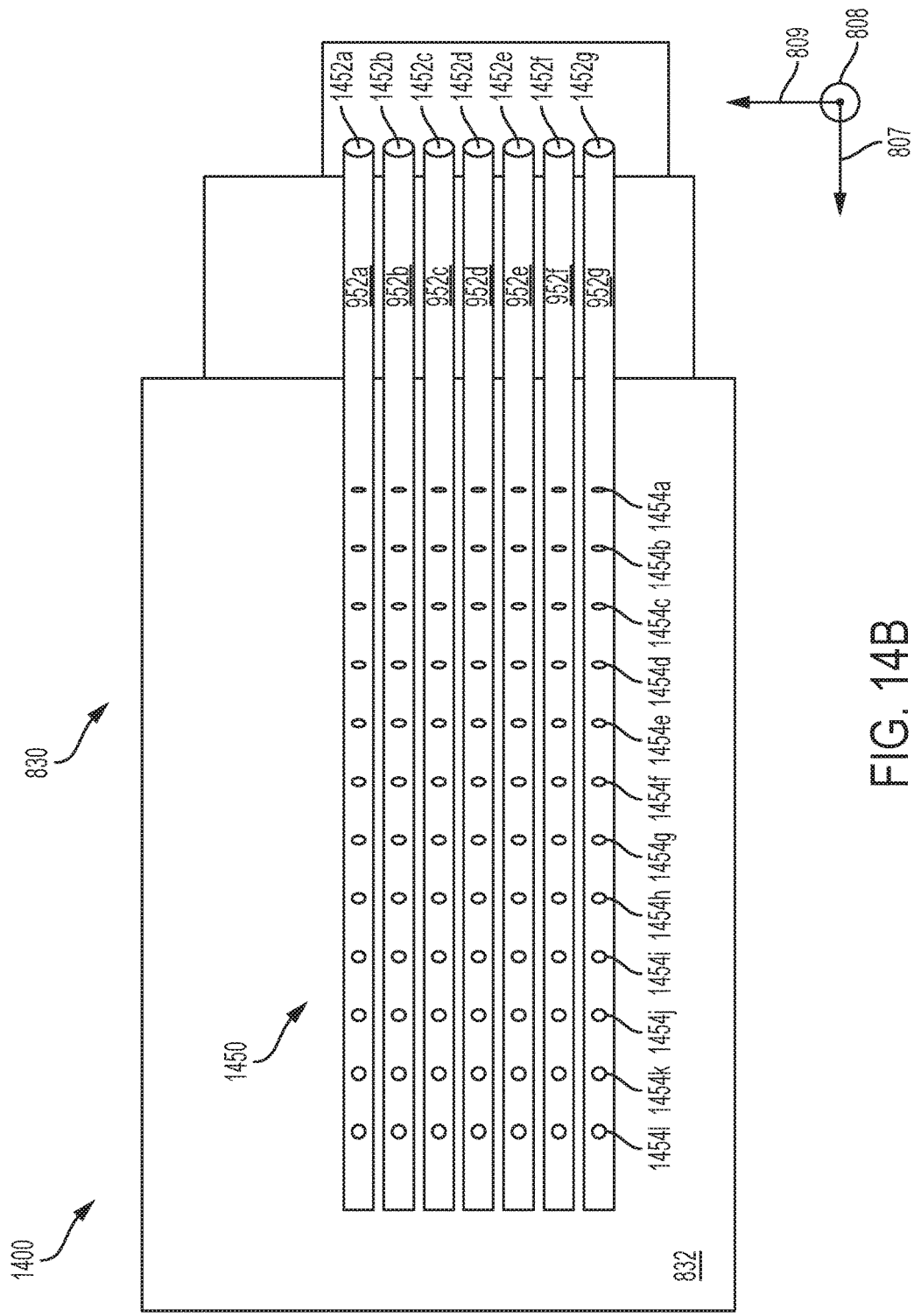
FIG. 14B is a view of the system of FIG. 14A taken along line 14B-14B.

Referring to FIGS. 14A and 14B, a block diagram of another example free radical transport system 1400 is shown. The free radical transport system 1400 can be used as the fluid transport system 202 of FIG. 2. FIG. 14A shows a side view of the transport system 1400. FIG. 14B shows a cross-sectional view of the transport system 1400 taken along the line 14B-14B of FIG. 14A.

The transport system 1400 includes a manifold 1450 (FIG. 14B) that includes a plurality of conduits 1450a-1450g. The plurality of conduits 1450a-1450g is connected to a source of free radicals 1405. In some implementations, each conduit 1450a-1450g is connected to a separate source of free radicals. The source 1410 produces free radicals 1405 that enter the conduits 1450a-1450g at openings 1452a-1452g, respectively, and flow in the conduits 1450a-1450g in a direction 1407.

Each of the conduits 1450a-1450g has openings 1454a-1454l, all of which form a passage through a wall of the conduit and release free radicals 1405 toward the element 1420. Thus, as compared to a transport system that includes a single conduit, the transport system 1400 can clean a larger area of an element 1420 without having to rotate or translate the manifold 1450. However, in some implementations, the manifold 1450 can be rotated or translated to further increase the size of the region that is cleaned by the free radicals 1405.

Further, in the conduits 1450a-1450g, the openings 1454a-1454l are each of a different size, with the sizes increasing in the direction 1407. This is similar to the openings 854a-854l of conduit 850 that are discussed above a with respect to FIGS. 8A-8C. As such, the conduits 1450a-1450g deliver the free radicals 1405 to the element 1420 at a uniform rate, which results in debris being cleaned from the element 1420 at a uniform rate. In other implementations, the openings 1454a-1454l can all be the same size. Although the manifold 1450 includes seven (7) conduits, more or fewer conduits can be used. Additionally, the conduits of the manifold can include more or fewer openings than shown, and the conduits can include different numbers of openings.

Figures 15A, 15B:
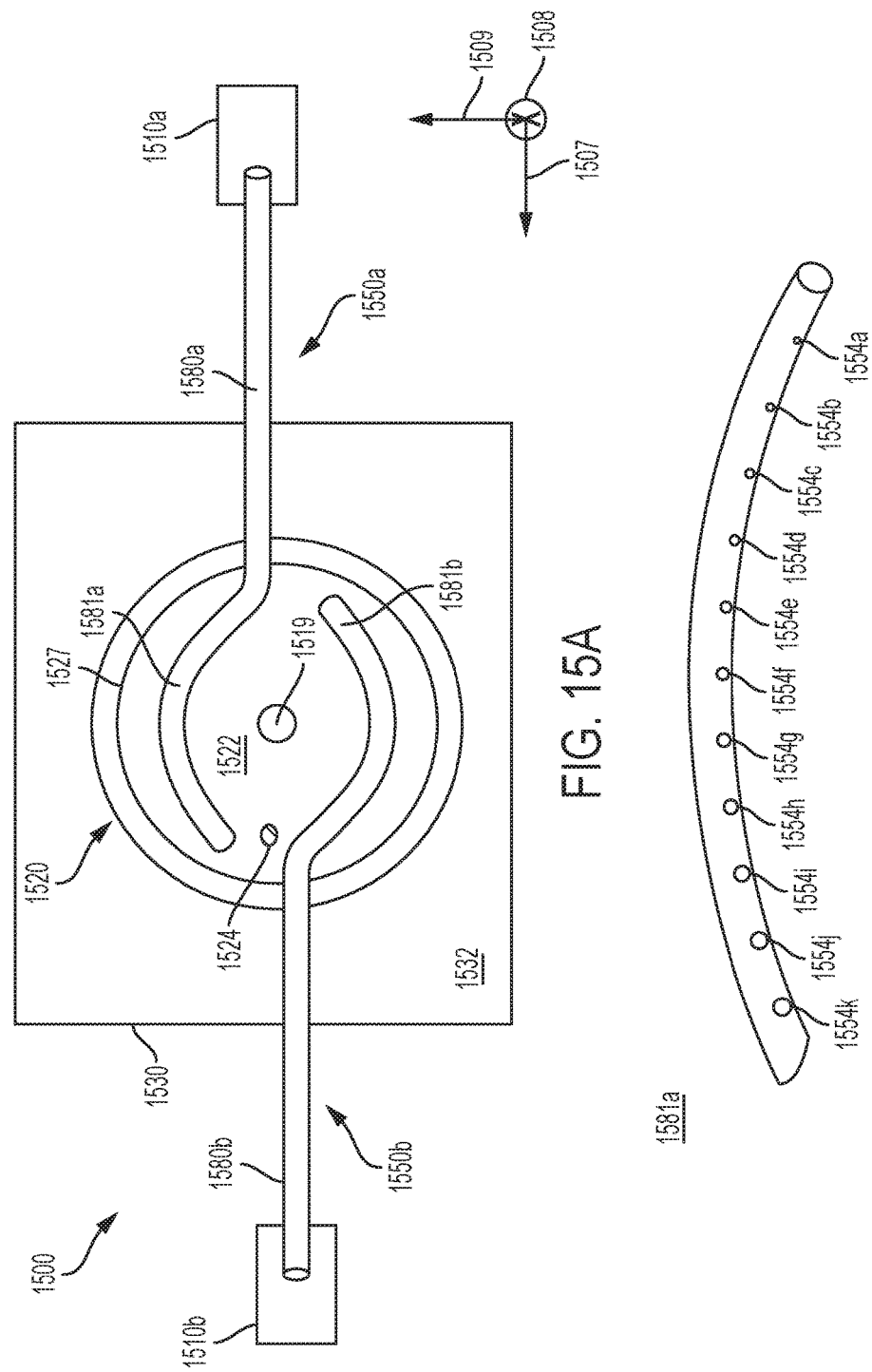
FIG. 15A is a view of an example of a free radical transport system.
FIG. 15B is a perspective view of a conduit that can be used in the system of FIG. 15A.

Referring to FIG. 15A, a block diagram of another example free radical transport system 1500 is shown. The view of the transport system 1500 is downward toward an element 1520 to be cleaned. The transport system 1500 can be part of an LPP EUV light source, such as the source 600 of FIG. 6A, and, in such an implementation, the element 1520 is in the interior 1532 of a vessel 1530. Additionally or alternatively, the free radical transport system 1500 can be used as the fluid transport system 202 of FIG. 2.

The transport system 1500 includes conduits 1550a, 1550b, each of which connects to a source of free radicals 1510a, 1510b, respectively. Free radicals from the sources 1510a, 1510b flow into the conduits 1550a, 1550b. Similar to the conduit 1050 discussed above, the conduits 1550a, 1550b are made from a material that has a low recombination rate.

The element 1520 defines a surface 1522 that accumulates debris 1524 by being in the path of plasma that is generated in the vessel 1530. The plasma can be generated by passing an amplified light beam through an aperture 1519 in the element 1520 to irradiate a target mixture (not shown) and convert the target mixture to plasma. The element 1520 can be, for example, a collector mirror that receives EUV light emitted by the plasma and focuses the light to a location that is out of the page of FIG. 15A. Thus, in FIG. 15A, the optical path of the amplified light beam and the focused EUV light is in a direction that is out of the page (opposite to the direction 1508, which is into the page). The optical path of the amplified light beam is out of the page, but also passes through the aperture 1519.

As compared to the transport systems shown in FIGS. 8A-8C, 13B, 14A, and 14B, the conduits 1550a and 1550b of the transport system 1500 are outside of the optical path. Like the transport system 800, the transport system 1500 can be used to clean the element 1520 "in-situ," or while the element 1520 is inside of the vessel 1530. Additionally, because the transport system 1500 is out of the optical path, the transport system 1500 can be used while the light source is in operation.

The conduits 1550a, 1550b have linear portions 1580a, 1580b and curved portions 1581a, 1581b. The curved portions 1581a, 1581b follow an edge 1527 of the element 1520, avoiding the optical path. The conduits 1550a, 1550b are made of a material that has a low recombination coefficient and thus delivers free radicals from the sources 1510a, 1510b to the interior of the vessel 1530.

Referring also to FIG. 15B, which shows the curved portion 1581a in more detail, the curved portion 1581a defines openings 1554a-1554k that pass free radicals and gas from an interior of the conduit 1550 toward the element 1520. The openings 1554a-1054k have different sizes, and the sizes increase with increasing distance from the source 1510a.

More or fewer openings can be formed in the curved portion 1581a than are shown in the example of FIG. 15B. The openings can be arranged similarly to one or more of the arrangements of openings shown and described with respect to FIGS. 8A-8B, 10, 11, and 12. For example, a plurality of rows of openings similar to the collection of openings 1554a-1554k can be formed in the portion 1581a. The conduit 1550b has similar openings in the portion 1581b, oriented to direct free radicals toward the element 1520.

Referring to FIG. 16, another example free radical transport system 1600 is shown. The free radical transport system 1600 includes a conduit 1650 that follows an edge 1627 of an element 1620 to be cleaned. Like the transport system 1500 of FIG. 15A, the transport system 1600 includes a conduit that is out of the optical path of the amplified light beam that is used to generate plasma and/or EUV light that is focused by the element 1620.

The transport system 1600 includes a conduit 1650 that is coupled to a source of free radicals 1610. Like the conduits 1550a, 1550b, the conduit 1650 is made of a material that has a low recombination coefficient and, thus, transports the free radicals generated by the source 1610 to the interior 1632 of a vessel 1630 that contains the element 1620. The conduit 1650 defines openings that pass free radicals toward the element 1620.

Referring to FIG. 17, a block diagram of an example EUV light source 1700 is shown. The light source 1700 includes an element cleaning system 1701. Like the transport systems 800, 1500, and 1600, and the cleaning system 201, the element cleaning system 1701 can be used to clean an optical element. In the example of FIG. 17, the optical element is an element 1720, which is in an interior 1732 of a vacuum vessel 1730. The cleaning system 201 cleans the element 170 with free radicals 1705 "in-situ" (while the element 1720 is in the interior 1732 of the vessel 1730 and without having to move the element 1720). As discussed above, a free radical is an atom, molecule, or ion that has an unpaired valence electron or an open electron shell, and, therefore, may be seen as having a dangling covalent bond. The dangling bonds can make free radicals highly chemically reactive, that is, a free radical can react readily with other substances. Because of their reactive nature, free radicals can be used to remove a substance (such as debris) from an object. The free radicals can remove the debris by, for example, etching, reacting with, and/or combusting the debris.

In addition to the free radicals 1705, the element cleaning system 1701 also uses gasses 1776 and 1777, which are gasses that do not include free radicals, to clean the element 1720. Using the gasses 1776 and 1777 with the free radicals 1705 can achieve quicker cleaning of the element 1720. In FIG. 17, the free radicals 1705 are shown with solid line arrows and the gasses 1776 and 1777 are shown with dashed line arrows. The manner in which the free radicals 1705, the gas 1776, and the gas 1777 are directed toward the element 1720 are defined by one or more flow patterns. The flow patterns allow the characteristics of the flow of the free radicals 1705, the gas 1776, and the gas 1777 to be varied such that the element 1720 can be cleaned more quickly.

The element cleaning system 1701 includes a free radical transport system 1702, which directs free radicals 1705 through a conduit 1750 to a surface 1722 of the element 1720. The conduit 1750 is out of the optical path of the light source 1700, thus, the element cleaning system 1701 can be operated to clean the surface 1722 of the element 1720 while the light source 1700 is in operation (for example, while the light source 1700 is producing the EUV light 1716).

The conduit 1750 can be, for example, either of the conduits 1550 (FIGS. 15A and 15B), or 1650 (FIG. 16), or the conduit 1750 may have another design. FIGS. 18A and 18B, discussed below, show an example of a conduit that can be used in the light source 1700. The conduit 450 shown in FIGS. 4A-4C also can be used in the light source 1700.

The element cleaning system 1701 also includes a control system 1755 and a gas source 1712, which provides a gas 1713 (such as diatomic molecular hydrogen (H2) gas, helium gas (He), and/or argon gas (Ar)) to the interior 1732 of the vacuum vessel 1730. The control system 1755 controls the flow of the gas 1713 and the flow of the free radicals 1705. The gas 1713 that enters the interior 1732 flows into a space 1703 around the element 1720. The gas flows in the space 1703 as the gas 1776 and the gas 1777.

The flow of the gas 1713 and the free radicals 1705 is specified by one or more flow patterns that are stored in a flow pattern store 246. The flow pattern or patterns include information that specifies characteristics such as the flow rate of the gas 1713 and the free radicals 1705. The flow patterns allow the control system 1755 or an operator of the light source 1700 to manage and change the characteristics of the gas 1713 and the free radicals 1705 to optimize the cleaning of the element 1720.

The light source 1700 includes a target material supply apparatus 1727, which delivers target material 1778 to a target location 1704 in the interior 1732 of the vacuum vessel 1730. A sidewall 1736 defines the interior 1732. The amplified light beam 610, which is emitted from the optical source 615, passes through a sidewall 1736 and an aperture 1717 of the element 1720 in the z direction to the target location 1704. The amplified light beam 610 interacts with the target material 1778 to form a plasma 1717 that emits EUV light 1716 and debris 1724. Some of the EUV light 1716 is reflected by the surface 1722 of the element 1720 as reflected EUV light 1715. The reflected EUV light 1715 exits the vacuum vessel 1730 toward a lithography system 1799.

The free radical transport system 1702 includes a source 1710 and the conduit 1750, which transports free radicals from the source 1710. The conduit 1750 is coupled to the source 1710 at an opening 1752 that is formed in an end of the conduit 1750. Free radicals generated at the source 1710 flow into the conduit 1750 through the opening 1752 and exit the conduit 1750 through an opening 1754 that passes through a sidewall 1756 of the conduit 1750. The free radicals 1705 can flow from the source 1710 into the interior 1732 of the vacuum vessel 1730 due to a pressure differential between the interior 1732 of the vacuum vessel 1730 and the source 1710 and/or the interior of the conduit 1750, with the pressure of the interior 1732 being lower than the pressure at the source 1710 and the pressure in the interior of the conduit 1750. The free radicals 1705 that exit the conduit 1750 through the opening 1754 are directed toward the surface 1722 of the element 1720 by positioning the opening 1754 toward to the surface 1722. The conduit 1750 is made of a material similar to the material from which the conduit 750 (FIGS. 7A and 7B) is made from. Like the conduit 750, the conduit 1750 can be made from, for example, Teflon, quartz, glass, a metal oxide, and/or a metal that is coated with a material that has a low recombination rate.

The conduit 1750 is positioned in the interior 1732 relative to the element 1720 with a gap 1797 between the conduit 1750 and the element 1720. The gap 1797 is a physical separation between the element 1720 and the conduit 1750 through which fluid can pass. In other words, at least a portion of the conduit 1750 does not make physical contact with the element 1720. Additionally, the conduit 1750 is positioned so that no part of the conduit 1750 intersects the amplified light beam 610. Furthermore, the conduit 1750 is positioned to not be between the surface 1722 of the element 1720 and the EUV light 1716 emitted from the plasma 1717. In this manner, the element cleaning system 1701 can be operated to clean the element 1720 while the light source 1700 produces EUV light 1716.

In the example shown, the element 1720 is held and supported in a fixed location in the interior 1732 of the vacuum vessel 1730 by a mount 1718. The mount 1718 has a sidewall 1719*a*, which extends into the interior 1732 of the vacuum vessel 1730, and a lip 1719*b*, which extends from the sidewall 1719*a* into a gap 1797. The lip 1719*b* extends from the sidewall 1719*a* along a different direction than the direction that the sidewall 1719*a* extends. In the example shown in FIG. 17, the sidewall 1719*a* extends along the z direction, and the lip 1719*b* extends away from an end of the sidewall 1719*a* along the y direction, which is perpendicular to the z direction.

When the element 1720 is in the mount 1718, the space 1703 is formed between the sidewall 1719*a* and the element 1720 and/or on a side of the element 1720, which is on a side of the element 1720 other than a side that includes the surface 1722. Some of the gas 1713 from the gas source 1712 flows through the portion of the space 1703 that is between the sidewall 1719*a* and the element 1720. The gas that flows through this portion of the space 1703 is shown as the gas 1776 in FIG. 17.

The relative orientation of the lip 1719*b* and the sidewall 1719*a* causes the gas 1776 to be directed toward the surface 1722 of the element 1720. The lip 1719*b* extends away from the sidewall 1719*a* from a location that is just outside of a perimeter 1727 of the element 1720 toward the center of the element 1720. Thus, the gas 1776 flows from the perimeter 1727 of the element 1720 toward the center of the element 1720. The gas 1776 can be referred to as "perimeter gas flow."

The gas 1713 from the gas source 1712 also flows through the aperture 1717 of the element 1720. The gas that flows through the aperture 1717 is labeled as gas 1777 in the example of FIG. 17 and can be referred to as "aperture gas flow." The gas source 1712 is a source of gas that does not include free radicals. Although one gas source 1712 is shown in FIG. 17, the light source 1700 can include a plurality of gas sources that deliver gas to the interior 1732 of the vacuum vessel 1730. For example, one gas source can deliver the gas 1775 and another gas source can deliver the gas 1776.

The element cleaning system 1701 also includes the control system 1755. The control system 1755 controls the position of the conduit 1750 relative to the element 1720, and also controls the flow of the gas 1776, the gas 1777, and/or the free radicals 1705. For example, the control system 1755 can adjust the flow rates of the gas 1776, the gas 1777, and/or the free radicals 1705 relative to each other to decrease the amount of time required to remove the debris 1724 from the surface 1722. In some implementations, the control system 1755 can start or stop the flow of one of more of the gas 1776, the gas 1777, and/or the free radicals 1705 to initiate or end a cleaning cycle. The control system 1755 can control the flow of the gas 1776, the gas 1777, and/or the free radicals 1705 using information included in the flow patterns of the flow pattern store 1746.

The example control system 1755 shown in FIG. 17 includes a conduit controller 1740, a flow controller 1741, an electronic processor 1742, an electronic storage 1743, and an input/output (I/O) interface 1744. The conduit controller 1740 controls the position of the conduit 1750 relative to the element 1720. The conduit controller 1740 can control the position of the conduit 1750 (and the opening 1754 through which the free radicals 1705 exit the conduit 1750) in the x, y, and/or z directions, and the conduit controller 1740 can rotate the conduit 1750 and the opening 1754 relative to the element 1720 and the surface 1722. For example, the conduit controller 1740 can move the opening 1754 closer to the element 1720 in the z direction, or the conduit controller 1740 can move the conduit 1750 relative to the element 1720 in the x-y plane to direct the free radicals 1750 toward one portion of the surface 1722 at a time. The conduit controller 1740 can be used to position the conduit 1750 relative to the element 1720 and the surface 1722 when the conduit 1750 is initially installed in the interior 1732 of the vacuum vessel 1730, after the conduit 1750 has been installed in the interior 1732, and/or while the light source 1700 and radical transport system 1702 are in use.

The conduit controller 1740 includes components that are electronically controlled. For example, the conduit 1750 can be coupled to a stepper motor or other device that moves the conduit 1750 when activated by a user or an automated electronic process. The conduit controller 1740 can include components that are configured for manual operation, for example, with a lever, wheel, or other mechanical device that is accessible from outside of the vessel 1730 and allows an operator of the light source 1700 to move the conduit 1750.

The flow controller 1741 is used to control the flow of the free radicals 1705 and the gasses 1776 and/or 1777. The flow controller 1741 can include a mass flow controller that measures and/or controls the flow of the gas 1776 and/or the gas 1777 and a pressure controller that controls the relative pressure between the source 1710 of free radicals and the interior 1732 of the vacuum vessel 1730. The mass flow controller is connected to the gas source 1712, and the mass flow controller includes an input port, an outlet port, a mass flow sensor, and a valve. The mass flow controller adjusts the valve to adjust the flow of gas from the gas source 1712. Alternatively, the mass flow rates of gas 1776 and gas 1777 can be controlled separately using two separate mass flow controllers and two separate inlet gas systems (not shown).

The pressure controller can control one or more of the pressure of the source 1710 of free radicals and the pressure in the interior 1732. The free radicals from the source 1710 flow into the interior 1732 of the vacuum vessel 1730 when the pressure in the interior 1732 is lower than the pressure at the source 1710.

In some implementations, the control system 1755 does not include the conduit controller 1740 and/or the flow controller 1741. For example, in some implementations, the conduit 1750 is permanently positioned relative to the element 1720 and is not moved after installation or during use. In these implementations, the control system 1755 can lack the conduit controller 1740 or the conduit controller 1740 can be disabled.

The electronic processor 1742 is one or more processors suitable for the execution of a computer program such as a general or special purpose microprocessor, and any one or more processors of any kind of digital computer. Generally, a processor receives instructions and data from a read-only memory or a random access memory or both. The electronic processor 1742 can be any type of electronic processor.

The electronic storage 1743 can be volatile memory, such as RAM, or non-volatile memory. In some implementations, the electronic storage 1743 can include both non-volatile and volatile portions or components. The electronic storage 1743 stores instructions, perhaps as a computer program, that, when executed, cause the processor 1742 to communicate with other components in the control system 1755. For example, the control system 1755 can receive an input from a human operator or an automated electronic process at the I/O interface 1744 requesting that the flow rate of the gas 1777 be changed, and the processor 1742 can communicate a command to the flow controller 1741 to cause the mass flow controller to measure or determine the current flow rate of the gas 1777 and adjust the flow rate to match the requested flow rate.

The electronic storage 1743 also includes the flow pattern store 1746, which stores the one or more flow patterns. The flow patterns include information that describes or defines the characteristics of the flow of the free radicals 1705, the gas 1776, and/or the gas 1777. For example, the flow patterns can include information sufficient to cause the flow controller 1741 to adjust the flow rate of any of the free radicals 1705, the gas 1776, and the gas 1777. The flow rates of the free radicals 1705, the gas 1776, and the gas 1777 can be different from each other. The flow patterns also can include a time duration that specifies how long to direct the free radicals, the gas 1776, and the gas 1777 toward the element 1720 based on a particular flow pattern. In this way, one or more flow patterns can be used to define a cleaning cycle.

The I/O interface 1744 is any kind of electronic interface that allows the control system 1755 and/or its components to receive and/or provide data and signals to an operator and/or an automated process running on another electronic device. For example, the I/O interface 1744 can include one or more of a touch screen or a communications interface.

Referring to FIGS. 18A and 18B, top and side block diagrams, respectively, of an example of a fluid transport system 1801 are shown. The fluid transport system 1801 includes conduits 1850a and 1850b, and sources of free radicals 1810a, 1810b. The fluid transport system 1801 also includes a gas source 1812. The conduits 1850a, 1850b transport free radicals 1805 from the respective sources 1810a, 1810b toward a surface 1822 of an optical element 1820. The gas source 1812 provides a gas that flows through an aperture 1817 of the optical element 1820 as "aperture gas flow" and around a perimeter 1827 of the optical element 1820 as "perimeter gas flow." The gas source 1812 can include a plurality of individual gas supplies. For example, the gas source 1812 can include a supply for the gas that flows through the aperture 1817 and a separate supply for the gas that flows around the perimeter 1827.

The optical element 1820 can have a mirrored surface that is positioned in the path of EUV light and debris that are generated by a plasma that is created from an interaction between an amplified light beam (such as the light beam 610) and a target material (such as the target material 1778). In these implementations, the optical element 1820 may be referred to as a collector mirror. The element cleaning system 1801 is out of the path of the amplified light beam and is not between the surface 1822 and the EUV light emitted by the plasma. Thus, the element cleaning system 1801 can be used while an EUV light source that includes the optical element 1820 is in use and while the light source generates EUV light.

The fluid transport system 1801 can be used in the EUV light source 1700 to clean the collector mirror 1722 of FIG. 17. The element cleaning system 1801 includes conduits 1850a, 1850b that can be installed in an EUV light source at the time that the EUV light source is manufactured or as a retrofit of an existing EUV light source.

Alternatively or additionally, the fluid transport system 1801 can be used as the fluid transport system 202 of FIG. 2. In these implementations, the conduits 1850a, 1850b are used as the conduit 250. The sources 1810a, 1810b, and the gas source 1812 are used as the fluid supply 210. As discussed with respect to FIG. 2, the optical system 203 can be any type of optical system. Thus, the fluid transport system 1801 can be used with an optical system other than an EUV light source. Additionally, in implementations in which the optical system is an EUV light source, the element 1820 can be an optical element other than a mirror that is in the path of plasma generated by an interaction between an amplified light beam and a target material.

The element cleaning system 1801 cleans the element 1820 by delivering free radicals 1805, a gas 1876, and a gas 1877 to the surface 1822. The gasses 1876 and 1877 can be the same type of gas, and the gasses 1876 and 1877 can be gasses that do not contain free radicals. The gasses 1876 and 1877 are generated by one or more gas sources, such as the gas source 1712 (FIG. 17). In FIGS. 18A and 18B, the free radicals 1805 are shown with solid line arrows and the gasses 1876 and 1877 are shown with dashed line arrows.

The optical element 1820 has a circular cross-section in the x-y plane (FIG. 18A) and the surface 1822 is curved as shown in FIG. 18B. The optical element 1820 has an aperture 1817 that passes through the optical element 1820 in the z direction. The gas 1877 flows through the aperture 1817 in the z direction. The optical element 1820 also has a perimeter 1827. The perimeter 1827 includes the portions of the optical element 1820 that are furthest from the center of the aperture 1817, including the circumferential edge of the optical element 1820. In the example of FIGS. 18A and 18B, the perimeter 1827 has a circular shape in the x-y plane.

The element 1820 is held by a mount 1818 that includes a sidewall 1819a. A space 1803 is formed between the mount 1818 and portions of the element 1820. The space 1803 includes a region 1803a, which is between the sidewall 1819a and the element 1820, and a region 1803b, which is at the side 1823 of the element 1820. The space 1803 receives the gasses 1876 and 1877 from one or more gas sources (not shown). In some implementations, a shroud, such as the hollow conical shroud 650 (FIG. 6A), that has sides that taper in the z direction to define an open region can be placed in the space 1803b in contact with the side 1823 and with the open region of the shroud in fluid communication with the aperture 1817. In these implementations, the gas 1877 flows in the z direction through the open region defined by the shroud before flowing through the aperture 1817.

The mount 1818 also includes a lip 1819b that extends from the sidewall 1819a at an angle. The lip 1819b extends into a gap 1897, which is an open region between the perimeter 1827 and a portion of a conduit 1850a, 1850b that delivers the free radicals 1805 to the surface 1822. The lip 1819b surrounds the perimeter 1827 but is displaced, in the z direction and radially, from the perimeter 1827. In other words, a gas that flows in the z direction in the space 1803a interacts with the lip 1819b and flows out of the space 1803a from the perimeter 1827 toward the surface 1822.

The element cleaning system 1801 includes two conduits 1850a and 1850b that transport free radicals from respective sources 1810a, 1810b of free radicals to the surface 1822 of the element 1820. The conduits 1850a, 1850b include sidewalls 1856a, 1856b, each of which define an interior of the respective conduit 1850a, 1850b. The conduits 1850a, 1850b are made of a material that does not react or combine with the free radicals or one that has a low recombination coefficient (for example, a recombination coefficient of about 5×10-3 or less) so that free radicals 1805 can flow in the interiors of the conduits 1850a, 1850b. For example, the conduits 1850a, 1850b can be made of Teflon, quartz, or glass such as borosilicate glass (for example, Pyrex), or a metal that is coated with a material that has a low recombination coefficient.

The sidewalls 1856a, 1856b of the conduits 1850a, 1850b include respective linear portions 1880a, 1880b and curved portions 1881a, 1881b. In the linear portions 1880a, 1880b, the sidewalls 1856a, 1856b extend along a longitudinal axis that is substantially straight. The linear portion 1880a is connected to the source 1810a at an opening 1852a, which is formed in an end of the linear portion 1880a, and the linear portion 1880b is connected to the source 1810b at an opening 1852b, which is formed in an end of the linear portion 1880b. Free radicals generated by the sources 1810a, 1810b flow through the openings 1852a, 1852b into the linear portions 1880a, 1880b, respectively. The interior of the linear portion 1880a is in fluid communication with the interior of the curved portion 1881a, and the interior of the linear portion 1880b is in fluid communication with the interior of the curved portion 1881b. Thus, free radicals that flow into the linear portions 1880a, 1880b can flow into the respective curved portions 1881a, 1881b.

The sidewalls 1856a, 1856b are curved in the curved portions 1881a, 1881 b. The curved portions 1881a, 1881 b include openings 1854 that pass through the sidewalls 1856a, 1856b to allow free radicals in the interior of the curved portions 1881a, 1881b to exit the conduit 1850a, 1850b. For simplicity, only one opening 1854 is labeled on each of the curved portions 1881a, 1881 b. However, the curved portions 1881a, 1881 b can include any number of openings 1854 that are spaced from each other along a curved portion by a center-to-center radial distance "d." The openings 1854 can have a diameter of, for example, 4.5-6.5 millimeter (mm). The openings 1854 can have a circular cross-section. The distance "d" between two of the openings 1754 can be, for example, 1-10 centimeters (cm).

Additionally, the openings 1854 can all be the same size, or the size of the openings 1854 can vary. For example, the openings can become larger as the distance that a free radical travels from the source 1810a, 1810b increases. Such an arrangement may allow the free radicals 1805 to exit the conduits 1850*a*, 1850*b* at the same rate from all of the openings 1854.

In some implementations, the spacing "d" between openings 1854 can be made variable along the length of the curved portions 1881*a* and 1881*b*. In other words, the spacing "d" can be different between any two of the openings 1854. For example, the spacing "d" between the openings 1854 can be made smaller as the free radicals travel distance from the sources 1810*a*, 1810*b* increases. That is, the openings 1854 can be closer together (the spacing "d" lower) in the part of the curved portions 1881*a*, 1881*b* that are away from the linear portions 1880*a*, 1880*b* and farther apart in the parts of the curved portions 1881*a*, 1881*b* that are near the linear portions 1880*a*, 1880*b*. This configuration of the openings 1854 can result in the free radicals being delivered at the same rate from every unit length of the curved portions 1881*a*, 1881*b* regardless of the distance to the sources 1810*a*, 1810*b*. In some implementations, a combination of different holes diameters and different spacing "d" between the openings 1854 throughout the length of the curved portions 1881*a*, 1881*b* can also be used to provide radicals at the same rate from every length of the curved portions 1881*a*, 1881*b* regardless of the distance to the sources 1810*a*, 1810*b*.

The curved portions 1881*a*, 1881*b* are displaced from the element 1820 in the z direction, and the gap 1897, which is a space through which gas can flow, is formed between the curved portions 1881*a*, 1881 *b* and the perimeter 1827. In the configuration shown in FIGS. 18A and 18B, the curved portions 1881*a*, 1881*b* are in an x-y plane that is parallel to an x-y plane that contains the perimeter 1827, with these two x-y planes being separated in the z direction by the gap 1897. However, the curved portions 1881*a*, 1881*b* can be positioned in other configurations relative to the element 1820. Additionally, either or both of the curved portions 1881*a*, 1881 *b* can be moved relative to the element 1820 to, for example, optimize cleaning of a particular portion of the surface 1822.

In the example of FIG. 18A, each of the curved portions 1881*a*, 1881*b* forms part of a circle. The radius of the circle formed by both of curved portions 1881*a*, 1881*b* is the same or greater than the radius of the element 1820. The radius of curvature of the portions 1881*a*, 1881*b* is the same or greater than the radius of curvature of the perimeter 1827 of the element 1820. Thus, when the curved portions 1881*a*, 1881 *b* are placed above (in the z direction) and radially outside of the perimeter 1827, such as the configuration of FIGS. 18A and 18B, the openings 1854 can be oriented such that free radicals 1805 flow from a region near the perimeter 1827 radially inward toward the surface 1822. For example, the curved portions 1881*a*, 1881*b*, which include the openings 1854, can be at the perimeter 1827 or at a distance of up to, for example, 10-15 centimeters (cm) from the perimeter 1827.

Additionally, as discussed above, the lip 1819*b* of the mount 1818 extends into the gap 1897 at an angle from the sidewall 1818*a* to direct the gas 1876 radially inward toward the surface 1822. The lip 1819*b* is also above (in the z direction) and radially outside of the perimeter 1827. Thus, the gas 1876 flows from the perimeter 1827.

Due to the configuration of the conduits 1850*a*, 1850*b*, the element 1820 can be cleaned by the fluid transport system 1801 while the surface 1822 of the optical element 1820 interacts with light.

Figure 19:
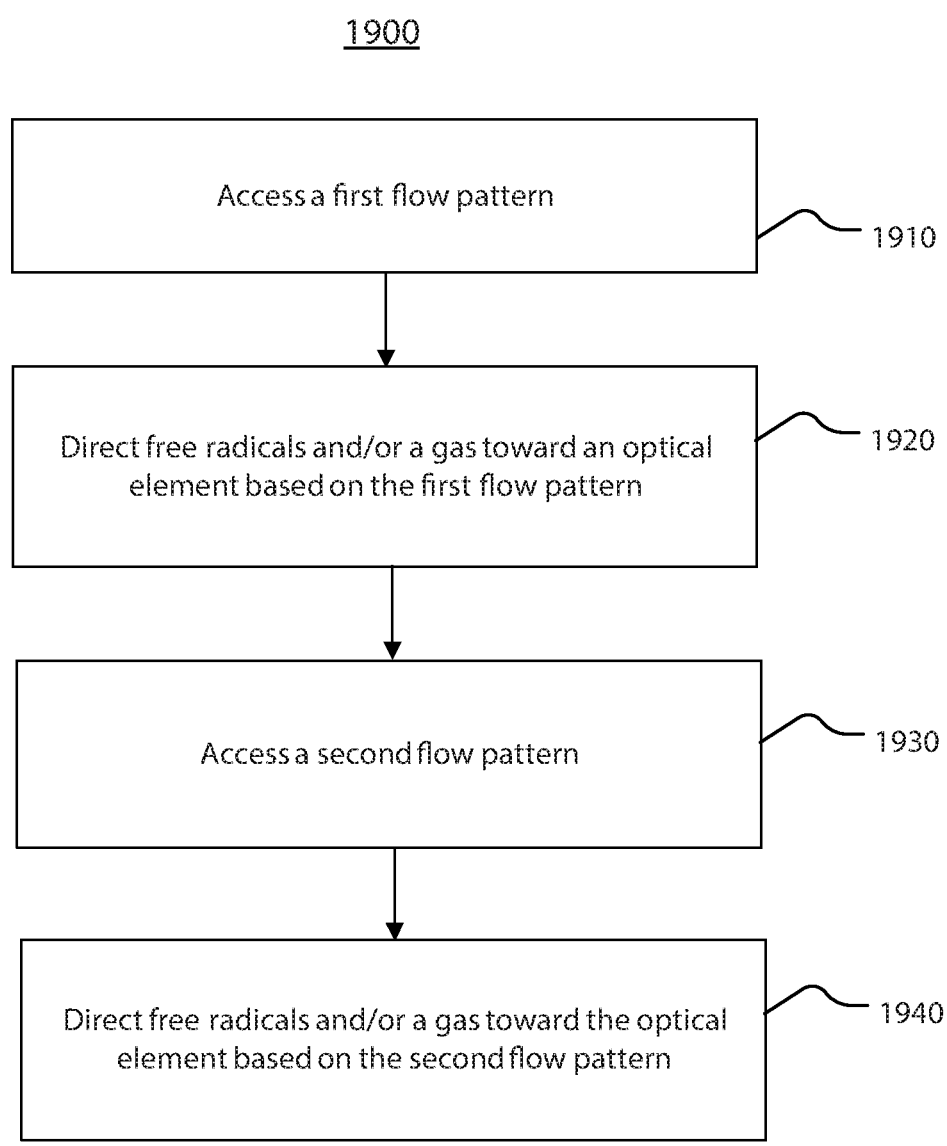
FIG. 19 is a flow chart of an example of a process for cleaning an optical element.

Referring to FIG. 19, a flow chart of an example process 1900 is shown. The process 1900 is used to remove debris from a surface of an optical element. For example, the process 1900 can be used to remove debris from an element that is inside of a vacuum vessel of an EUV light source. The process 1900 removes debris from the element without requiring that the element be removed from its operating environment and can be used while the optical element is in use. For example, in implementations in which the optical element is inside of a vacuum vessel of an EUV light source, the process 1900 can be performed while the EUV light source is operating (for example, while the EUV source is producing EUV light).

The process 1900 can be performed by the electronic processor 242 of the control system 255 (FIG. 2) or the electronic processor of the control system 1755. For example, the process 1900 can be a set of instructions, perhaps a computer program, stored on the electronic storage 242 that, when executed, cause the one or more electronic processors 242 to cause various components of the control system 255 to interact to clean the element 220.

The process 1900 is discussed with respect to the fluid transport system 1801 (FIGS. 18A and 18B) and the control system 255. However, the process 1900 can be performed with any EUV light source that includes an element cleaning system such as the element cleaning system 1701 (FIG. 17).

A first flow pattern is accessed (1910). The first flow pattern can be accessed from the flow pattern store 246. The first flow pattern includes information sufficient to define the characteristics of a fluid flow. The first flow pattern can be stored in the flow pattern store 246 as, for example, an electronic file or as a set of instructions in the form of a computer program. The first flow pattern can be selected from a plurality of flow patterns in the flow pattern store 246. The various flow patterns in the flow pattern store 246 can each be associated with one or more optical elements, debris types, and/or optical systems, with a particular flow pattern being optimized for certain conditions. Thus, the accessed first flow pattern can be selected based on the shape of the optical element 1820, the type of debris expected to be on the surface 1822, and/or the optical system in which the optical element 1820 is used.

One or more of the free radicals 1805, the gas 1877, and the gas 1876 are directed toward the surface 1822 based on the accessed first flow pattern (1920).

The first flow pattern indicates whether the free radicals 1805 flow in both of the conduits 1850*a* and 1850*b* or in just one of the conduits 1850*b*. If the first flow pattern indicates that the free radicals 1805 flow in just one of the conduits 1850*a*, 1850*b*, the first flow pattern indicates in which conduit the free radicals 1805 flow. Additionally, when the first flow pattern indicates that the free radicals 1805 flow in the conduits 1850*a* and 1850*b*, the first flow pattern indicates the flow rate of the free radicals 1805 in each conduit. The flow rates in each conduit 1805*a*, 1805*b* can be the same as each other or different from each other. In examples in which the first flow pattern indicates that the free radicals 1805 flow in both conduits 1850*a*, 1850*b* at the same time and at different rates, the first flow pattern can indicate the relative flow rates in the conduits 1850*a*, 1850*b* by, for example, a ratio.

The free radicals 1805 are generated by the sources 1810*a*, 1810*b*, which are coupled to the conduits 1850*a*, 1850*b* at openings 1852*a*, 1852*b*, respectively. The sources 1810*a*, 1810*b* can be microwave plasma generators. To produce free radicals with such a source, a gas from which the free radicals are formed is provided to the sources 1810*a*, 1810*b*. For example, to produce hydrogen radicals, hydrogen gas ($H_2$) is provided. An additional gas can be added to the gas prior to providing the gas to the sources 1810*a*, 1810*b*. For example, a mixture of argon and oxygen (Ar/O$_2$) can be added to the hydrogen gas. Both the hydrogen gas and the additional gas mixture have a mass flow rate and velocity when provided to the sources 1810*a*, 1810*b*. For example, the hydrogen gas can be provided to the sources 1810*a*, 1810*b* at a mass flow rate of 3 standard liters per minute (SLM), and the Ar/O$_2$ mixture can be provided to the source at a mass flow rate of 21 standard cubic centimeters per minute (SCCM).

The first flow rate can include information sufficient for the sources 1810*a*, 1810*b* to set the mass flow rate between, for example, 3-15 SLM. Furthermore, the sources 1810*a*, 1810*b* can be separately controlled so that the flow rates in the conduits 1850*a* and 1850*b* are different. For example, the flow rate of the free radicals 1805 in the conduit 1850*a* can be 3 SLM, and the flow rate of the free radicals 1805 in the conduit 1050*b* can be 15 SLM.

The first flow pattern also can indicate the direction of flow of the free radicals 1850. The free radicals 1805 are directed to the surface 1822 by orienting the openings 1854 relative to the surface 1822. For example, the free radicals 1805 can be directed from a perimeter region of the element 1820 by placing the opening 1854 near the perimeter 1827 and orienting the openings 1854 toward a center of the surface 1822. The conduits 1850*a* and/or 1850*b* can be placed at the perimeter 1827 of the element 1820, or the conduits 1850*a* and/or 1850*b* can be placed above the perimeter 1827 in the z direction (FIGS. 18A and 18B). For example, either or both of the conduits 1850*a* and 1850*b* can be positioned 1-10 cm above (in the z direction shown in FIGS. 18A and 18B) an x-y plane that includes the perimeter 1827. In such a configuration, the free radicals 1805 flow from the outer edge of the element 1820 toward the center of the element 1820.

The first flow pattern can indicate the direction of flow of the free radicals 1850 through information that is sufficient to cause either or both of the conduits 1850*a*, 1850*b* to move relative to the surface 1822. The conduits 1850*a*, 1850*b* can be moved by translation, rotation, or in the z direction (FIGS. 18A and 18B). The conduits 1850*a* and 1850*b* can be moved independently of each other. Thus, the first flow pattern can include information that, when applied to the conduit controller 240 (FIG. 2), results in the conduit 1850*a* and/or the conduit 1850*b* moving and the free radicals 1805 flowing from the conduits 1850*a*, 1850*b* in different directions.

In addition to the free radicals 1805, the gas 1877 and the gas 1876 also can be directed toward the surface 1822 based on the accessed first flow pattern. The free radicals 1804, the gas 1877 (which flows through the aperture 1817), and the gas 1876 (which flows around the perimeter 1827) can be directed at different flow rates due to the first flow pattern. For example, the information included in the first flow pattern can be sufficient for the flow controller 241 to control the gas supply 1812 (which can include a plurality of distinct gas supplies) to set or adjust the flow rates of the gas 1877 and the gas 1876. The flow rates of the gas 1877 and the gas 1876 are individually controllable, and also can be controlled separately from the flow rate of the free radicals 1805. For example, the flow rate of the free radicals 1805 can be 3-15 SLM, the flow rate of the gas 1876 can be, for example, 0-90 SML, and the flow rate of the gas 1877 can be, for example, 0-90 SML.

Thus, in the example discussed above, the free radicals 1805 flow through two different conduits, the conduits 1850*a* and 1850*b*. The conduits 1850*a* and 1850*b* each provide a fluid path to the element 1820. The gas 1876 and the gas 1877 also flow through two different paths, with the gas 1876 flowing through the aperture 1817 and the gas 1876 flowing around the perimeter 1827. The paths through which the gas 1876 and the gas 1877 flow are not spatially coincident with the paths through which the free radicals 1805 flow.

Furthermore, the first flow pattern also can indicate the time duration for which the free radicals 1805, the gas 1876, and/or the gas 1877 are directed toward the element 1820. For example, the first flow pattern can indicate that the free radicals 1805, the gas 1876, and the gas 1877 are to be directed toward the surface 1822 at particular flow rates and in particular directions for 30 minutes to 2 hours.

The free radicals 1805, the gas 1876, and the gas 1877 flow relative to the surface 1822 and can move debris that is on the surface. Some of the debris that is not removed by the free radicals 1805, the gas 1876, or the gas 1877 is transported to other parts of the surface 1822. A stagnation region can form at the surface 1822. The stagnation region is a region at the surface 1822 through which fluid does not flow. The location of the stagnation region is determined by the flow characteristics (for example, flow rate, direction, and fluid type) of the free radicals 1805, the gas 1876, and/or the gas 1877.

More than one stagnation region can be present at the surface 1822 at a particular time. A relatively large portion of the transported debris becomes trapped in the stagnation region. Moving the stagnation region to another location on the surface 1822 can result in fluid being able to flow through the location where the original stagnation region was formed. In this way, debris that accumulated at the original stagnation region can be removed from the original stagnation region (and possibly also from the surface 1822 altogether). The stagnation region can be moved by changing the flow pattern.

A second flow pattern is accessed (1930). The second flow pattern is another flow pattern that is stored in the flow pattern store 246. The second flow pattern includes information similar to the kinds of information included in the first flow pattern, except at least one aspect of the information is different than the information in the first flow pattern. For example, the information included in the second flow pattern can be the same as the information included in the first flow pattern, except that the second flow pattern indicates that the flow of the gas 1877 is at a different rate than in the first flow pattern.

One or more of the free radicals 1805, the gas 1876, and the gas 1877 are directed toward the surface 1822 based on the accessed first flow pattern (1940). When the free radicals 1805, the gas 1876, and/or the gas 1877 are directed toward the element 1820 based on the second flow pattern, a second stagnation region is formed at a different location on the surface 1822. Because the second stagnation region is in a different location, fluid flows into and through the location at the surface 1822 where the first stagnation region was formed. This allows debris to be removed from the first stagnation region. The debris can be removed from the first stagnation region by reacting or combining with the free radicals 1805, by physical force of the gas 1876 and/or the gas 1877, or a combination of these mechanisms.

Although the example of FIG. 19 discusses accessing two flow patterns from the flow pattern store 246, in some implementations, a cleaning cycle includes only one flow pattern that forms a stagnation region of minimal severity such that the flow pattern can be used throughout a cleaning cycle.

Other implementations are within the scope of the following claims.

For example, the radius of curvature of the curved portions 1881a, 1881b of the conduits 1850a, 1850b (FIGS. 18A and 18B) can be different than the radius of curvature of the perimeter 1827 of the element 1820. The radius of a circle or partial circle formed by the curved portions 1881a, 1881b can be smaller than the radius of the element 1820. In these implementations, the curved portions 1881a, 1881b can be positioned above (in the z direction) the element 1820 but radially inside the perimeter 1827.

The element cleaning system 1801 can include one conduit with a single curved portion that is a circle or part of a circle. The element cleaning system 1801 can include more than two conduits that, when placed in proximity to each other, have a shape that is the same as a shape of the perimeter of the element. Each of the conduits of the element cleaning system 1801 can be connected to a separate free radical source or more than one conduit can be connected to a single free radical source.

The sources of free radicals discussed above, such as the sources 710, 810, 1510a, 1510b, 1610, 1710, 1810a, and 1810b are shown as being outside of their respective vacuum vessels. However, in some implementations, the source of free radicals can be placed inside the vacuum vessel.

In some examples, the sources 1810a, 1810b can be operated at a hydrogen pressure of greater than about 1 millibar (mbar), with a microwave power of 5 kiloWatts (kW) or greater and the mass flow rate of the hydrogen gas being greater than 20 SLM. Under these operating conditions, a relatively large portion (for example, 30% or more) of the hydrogen gas can disassociate into hydrogen radicals that can be transported by the conduits 1850a, 850b. Such operating conditions, in combination with the arrangement and geometry of the openings 1854 in the conduits 1850a, 1850b, can provide hydrogen radicals with a velocity of, for example, 1 meter per second (m/s) or greater.

In addition to the conduits 450a, 450b, 1850a, and 1850b, the conduit 250 (FIG. 2) can be any of the conduits 750, 850, 1050, 1150, 1250, 1350, 1450, 1050a, 1050b, 1150a, 1150b, and 1250.

What is claimed is:

1. A method comprising:
   directing a fluid toward a surface of an optical element based on a first flow pattern, the surface comprising debris and the fluid directed based on the first flow pattern moving at least some of the debris to a first stagnation region on a surface of the optical element; and
   directing the fluid toward the surface of the optical element based on a second flow pattern, the fluid directed based on the second flow pattern moving at least some of the debris to a second stagnation region on the surface of the optical element, the second stagnation region and the first stagnation region comprising different locations at the surface of the optical element, and wherein directing the fluid toward the optical element based on the second flow pattern removes at least some of the debris from the first stagnation region.

2. The method of claim 1, wherein the first and second flow patterns comprise information sufficient to indicate a flow of the fluid toward the surface of the optical element, the information comprising one or more of a flow rate, a spatial distribution of the fluid relative to the surface of the optical element, and a time period during which the fluid is directed toward the surface of the optical element.

3. The method of claim 1, wherein the fluid comprises a gas.

4. The method of claim 3, wherein the fluid comprises a free radical.

5. The method of claim 4, wherein the debris comprises a material, and the free radical combines or reacts with the material.

6. The method of claim 5, wherein the free radical combines or reacts with the material to thereby remove the material from the surface through one of combustion of the material, etching of the material, or reaction with the material.

7. The method of claim 1, wherein
   directing the fluid based on the first flow pattern comprises directing the fluid toward the surface of the optical element at a first flow rate, and
   directing the fluid based on the second flow pattern comprises directing the fluid toward the surface of the optical element at a second flow rate.

8. The method of claim 1, wherein
   directing the fluid based on the first flow pattern comprises directing the fluid toward the surface of the optical element at one or more of a first flow rate and a first direction, and
   directing the fluid based on the second flow pattern comprises directing the fluid toward the surface of the optical element at one or more of a second flow rate and a second direction.

9. The method of claim 1, wherein
   directing the fluid toward the surface based on the first flow pattern comprises directing the fluid toward the surface of the optical element through a first conduit positioned relative to a first side of the optical element at a first flow rate and through a second conduit positioned relative to a second side of the optical element at a second flow rate; and
   directing the fluid toward the surface based on the second flow pattern comprises directing the fluid toward the surface of the optical element through the first conduit at a third flow rate and through the second conduit at a fourth flow rate.

10. The method of claim 9, wherein the fluid is directed through the first conduit and the second conduit based on the first flow rate during a first time period, and the fluid is directed through the first conduit and the second conduit based on the second flow rate during a second time period.

11. The method of claim 10, wherein the fluid is directed through the first conduit and the second conduit concurrently during at least part of one or more of the first time period and the second time period.

12. The method of claim 9, wherein the first flow rate and the second flow rate are different from each other.

13. The method of claim 12, wherein the third flow rate and the fourth flow rate are different from each other, and at least one of the third flow rate and the fourth flow rate are different from the first flow rate or the second flow rate.

14. The method of claim 1, further comprising:
   selecting the first flow pattern and the second flow pattern from among a plurality of flow patterns.

15. The method of claim 1, wherein the fluid is directed toward the surface based on the first flow pattern during a first time period, and at least some of the debris accumulates and remains in the first stagnation region during the first time periods.

16. The method of claim 15, wherein directing the fluid toward the surface based on the second flow pattern moves at least some of the debris from the first stagnation region to the second stagnation region.

17. The method of claim 1, wherein the debris comprises tin.

18. The method of claim 1, wherein the first stagnation region and the second stagnation region are non-overlapping regions at the surface of the element.

19. The method of claim 1, wherein the first stagnation region and the second stagnation region are partially overlapping regions at the surface of the element.

* * * * *